(12) United States Patent
Maier et al.

(10) Patent No.: US 6,833,949 B2
(45) Date of Patent: Dec. 21, 2004

(54) FILM COATED OPTICAL LITHOGRAPHY ELEMENTS AND METHOD OF MAKING

(75) Inventors: Robert L. Maier, Ontario, NY (US); Lisa A. Moore, Corning, NY (US); Charlene M. Smith, Corning, NY (US)

(73) Assignee: Corning Incorporated, Corning, NY (US)

( * ) Notice: Subject to any disclaimer, the term of this patent is extended or adjusted under 35 U.S.C. 154(b) by 163 days.

(21) Appl. No.: 10/238,099

(22) Filed: Sep. 9, 2002

(65) Prior Publication Data

US 2003/0021015 A1 Jan. 30, 2003

Related U.S. Application Data

(62) Division of application No. 09/567,725, filed on May 10, 2000, now Pat. No. 6,466,365.
(60) Provisional application No. 60/195,682, filed on Apr. 7, 2000.

(51) Int. Cl.[7] .................................................. G02B 13/14
(52) U.S. Cl. ...................... 359/355; 65/30.1; 359/350; 430/5; 430/322; 430/323; 501/53; 501/54; 501/57
(58) Field of Search .......................... 65/30.1; 359/350, 359/355; 430/5, 322, 323; 501/53, 54, 57

(56) References Cited

U.S. PATENT DOCUMENTS

| 4,070,097 | A | 1/1978 | Gelber .......................... 350/165 |
| 4,560,576 | A | 12/1985 | Lewis et al. ................... 427/38 |
| 5,063,173 | A | 11/1991 | Gasser et al. ............... 437/129 |
| 5,144,634 | A | 9/1992 | Gasser et al. ................. 372/49 |
| 5,410,428 | A | 4/1995 | Yamagata et al. |
| 5,413,967 | A | 5/1995 | Matsuda et al. ............. 437/235 |
| 5,703,712 | A | 12/1997 | Komine et al. |
| 5,744,215 | A | 4/1998 | Neuman ....................... 428/141 |

(List continued on next page.)

FOREIGN PATENT DOCUMENTS

| JP | 5188203 | 7/1993 | |
| WO | 90/02964 | 3/1990 | ............ G02B/5/26 |
| WO | 99/12196 | 3/1999 | ......... H01L/21/316 |
| WO | 99/24869 | 5/1999 | ............. G03F/1/14 |

OTHER PUBLICATIONS

Solomon Musikant, Optical Materials, 1985, pp. 161–176.
Encyclopedia of Applied Physics, vol. 12, Nuclear Waste Management to Optics, Underwater, 1995, p. 473.
Encyclopedia of Applied Physics, vol. 19, Sonoluminescence to Steel, 1997, pp. 437–457.
Encyclopedia of Chemical Technology, Fourth Ed. vol. 12, Fuel Resources To Heat Stabilizers, 1994, pp. 614619.
Leybold Systems, http://www.leybold.com, 3 pages.

(List continued on next page.)

*Primary Examiner*—Audrey Chang
*Assistant Examiner*—Craig Curtis
(74) *Attorney, Agent, or Firm*—Walter M. Douglas; Timothy M. Schaeberle

(57) ABSTRACT

The invention provides coated optical lithography elements and methods of coating optical elements, and particularly optical photolithography elements for use in below 240 nm optical photolithography systems utilizing vacuum ultraviolet light (VUV) lithography wavelengths no greater than about 193 nm, such as VUV projection lithography systems utilizing wavelengths in the 193 nm or 157 nm region. The optical devices manipulate vacuum ultraviolet lithography light less than 250 nm utilizing a deposited silicon oxyfluoride film. The deposited silicon oxyfluoride optical coating assists in the manipulation of incident light and protects the underlying optical materials, layers, and surfaces.

28 Claims, 19 Drawing Sheets

U.S. PATENT DOCUMENTS

| | | | |
|---|---|---|---|
| 5,852,508 A | 12/1998 | Kubota et al. | 359/355 |
| 5,888,700 A | 3/1999 | West et al. | |
| 5,908,672 A | 6/1999 | Ryu et al. | 427/574 |
| 5,911,861 A | 6/1999 | Dubs et al. | 204/298.27 |
| 5,922,502 A | 7/1999 | Damme et al. | |
| 6,242,136 B1 | 6/2001 | Moore et al. | 430/5 |
| 2002/0035024 A1 | 3/2002 | Kato | |

OTHER PUBLICATIONS

USSN 09/397,577, filed Sep. 16, 1999, Projection Lithography Photomask Blanks, Preforms and Method of Making, Berkey et al. pp. 1–35.

USSN 09/397,573, filed Sep. 16, 1999, Vacuum Ultraviolet Transmitting Silicon Oxyfluoride Lithography Glass; Moore et al. pp. 1–33.

FILM COATED OPTICAL LITHOGRAPHY ELEMENTS AND METHOD OF MAKING

This application is a Divisional of application Ser. No. 09/567,72, filed May 10, 2000, now U.S. Pat No. 6,466,365, and which is incorporated by reference herein and the benefit claimed thereto.

CROSS REFERENCE TO RELATED APPLICATION

This application claims the benefit of U.S. Provisional Application Ser. No. 60/195,682, filed Apr. 7, 2000, entitled FILM COATED OPTICAL LITHOGRAPHY ELEMENTS AND METHOD OF MAKING, by Robert L. Maier, Lisa A. Moore and Charlene Smith.

BACKGROUND OF THE INVENTION

1. Field of the Invention

The present invention relates generally to coated optical lithography elements and methods of coating optical elements, and particularly to optical photolithography elements for use in below 240 nm optical photolithography systems utilizing vacuum ultraviolet light (VUV) lithography wavelengths no greater than about 193 nm, such as VUV projection lithography systems utilizing wavelengths in the 193 nm or 157 nm region.

2. Technical Background

Projection optical photolithography systems that utilize the vacuum ultraviolet wavelengths of light below 240 nm provide benefits in terms of achieving smaller feature dimensions. Such systems that utilize ultraviolet wavelengths in the 193 nm region or 157 nm wavelength region have the potential of improving integrated circuits with smaller feature sizes. Current optical lithography systems used by the semiconductor industry in the manufacture of integrated circuits have started to progress towards shorter wavelengths of light, such as from the 248 mm wavelength region towards the 193 nm region and may continue to progress to the 157 nm region. Commercial use and adoption of such shorter wavelengths in the manufacture of semiconductor integrated circuits has been hindered by the transmission nature of such vacuum ultraviolet wavelengths region through optical materials. Such slow progression by the semiconductor industry of the use of VUV light below 240 mm such as 193 nm or 157 nm light has been also due to the lack of economically manufacturable optical coatings, optical elements with optical film coatings and optical film precursor materials. For the benefit of vacuum ultraviolet photolithography in these short wavelengths below 240 nm such as the emission spectrum VUV window of a $F_2$ or an ArF excimer laser to be utilized in the manufacturing of integrated circuits there is a need for optical film coatings that have beneficial optical properties including good transmission and durability and that can be manufactured economically.

The use of oxide optical films such as $Al_2O_3$, $SiO_2$ $Y_2O_3$, $Sc_2O_3$ at wavelengths below 248 nm is hindered by the low transmission nature of such oxide films at such short VUV wavelengths. At 193 nm such oxide optical films that may have tolerable transmission are troubled by the formation of high fluence laser radiation exposure defects such as color center formations when exposed to the powerful and damaging 193 nm optical lithography radiation. At 157 nm such oxide optical materials do not have sufficient transparency for use as thin film optical layers, which limits 157 nm optical films to fluoride crystal materials such as $MgF_2$, $AlF_3$, $GdF_3$ and $LaF_3$. Such fluoride crystal materials with below 240 nm transmission form thin film optical layers comprised of small crystallites separated by voids and often can have packing densities approaching as low as 0.80. Such fluoride crystallite film voids are troublesome contamination sites which are prone to attracting contaminating vapors such as water which can strongly absorb below 185 nm wavelengths. Attempts to increase crystalline sizes and minimize such voids such as by using energetic ion assisted deposition lead to absorbing film layers owing to the low energy of disassociation of such fluoride crystal materials. Options for increasing the packing densities of such fluoride crystal films such as by heating the optical surface substrate to about 300° C. elevated temperatures is troublesome and particularly ill advised for high thermal expansion substrate materials such as $CaF_2$.

The present invention overcomes problems in the prior art and provides a means for economically manufacturing high quality optical coatings that can be used to improve the manufacturing of integrated circuits with vacuum ultraviolet wavelengths.

SUMMARY OF THE INVENTION

Figure 1:
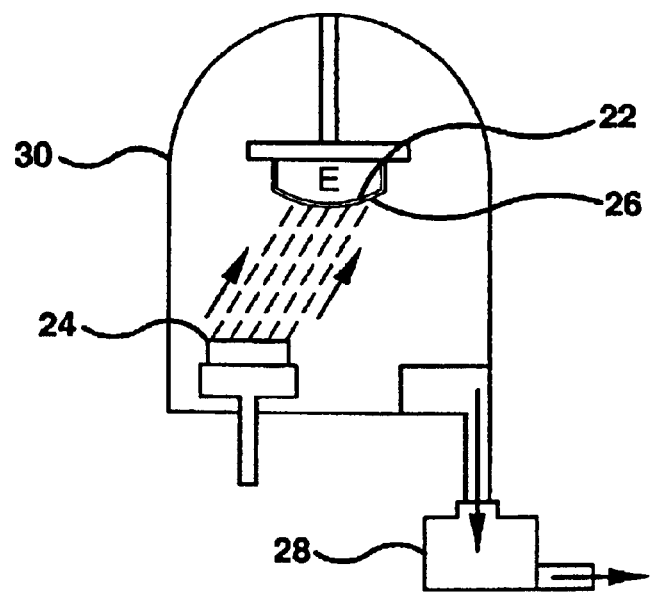
FIG. 1 shows a method of the invention.

One aspect of the present invention is a method of making an optical device. The method of making the optical lithography device for manipulating ultraviolet lithography light includes providing an optical surface and a silicon oxyhalide film preform precursor. The method further includes forming an optical coating on the optical surface with the optical coating formed on the optical surface from the provided silicon oxyhalide film preform.

Preferably the optical device of the invention manipulates vacuum ultraviolet lithography light less than 250 nm, preferably less than 240 nm, more preferably no greater than about 193 nm, and most preferably no greater than about 157 nm.

In another aspect, tile present invention includes a below 240 nm optical lithography device for manipulating below 240 mm wavelength optical lithography radiation having a wavelength band centered about a selected λ in the range of 157 nm to less than 240 nm with the device including a silicon oxyfluoride film. The lithography device includes an optical lithography element body that is comprised of an optical lithography medium having an internal transmission of at least 80%/cm at said selected λ. The device further includes an optical lithography coating overlaying the optical lithography element with the coating comprised of a silicon oxyfluoride film, with the silicon oxyfluonde film having a 50% transmission short cutoff wavelength at a wavelength that is less than said selected λ.

In a further aspect the present invention includes a method of making an optical element for manipulating below 250 nm light that includes the steps of providing an optical element surface for manipulating below 250 nm light that includes the steps of providing an optical element surface for manipulating below 250 nm photons and providing a silicon oxyfluoride glass. The method further includes vaporizing the provided silicon oxyfluoride glass and depositing the vaporized silicon oxyfluoride glass on the optical surface.

In another aspect the invention includes a method of making a silicon oxyfluoride film precursor preform glass vaporizable target. The inventive method includes providing particles of $SiO_2$ and doping the particles with fluorine. The method further includes consolidating the particles to form a fused silicon oxyfluoride glass vaporizable target for forming into a silicon oxyfluoride film.

In a further aspect the invention comprises a silicon oxyfluoride film precursor preform vaporizable glass target substrate for forming silicon oxyfluoride films. The film precursor is a silicon oxyfluoride glass with a fluorine content of at least 0.1 weight percent, and preferably has an internal transmission of at least 65%/cm in the wavelength range of 157 nm to 175 nm.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

DETAILED DESCRIPTION OF THE PREFERRED EMBODIMENTS

Figure 2:
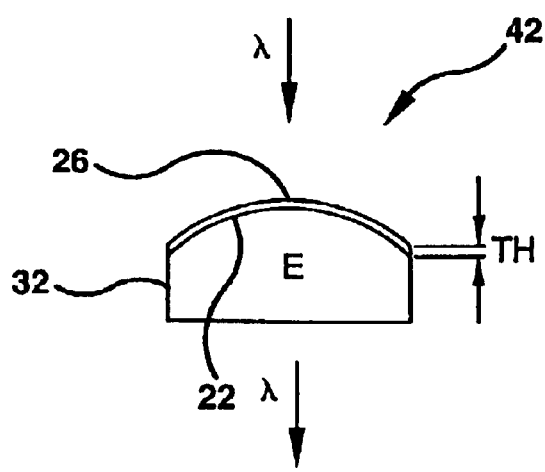
FIG. 2 is a side cross section view of an embodiment of the invention.

Reference will now be made in detail to the present preferred embodiments of the invention, examples of which are illustrated in the accompanying drawings. An exemplary embodiment of a method of making an optical device of the present invention is shown in FIG. 1. An exemplary embodiment of a below 240 nm optical lithography element device E is shown in FIG. 2 and is designated generally throughout as 42.

In accordance with the invention, the present invention for a method of making an optical lithography device for manipulating ultraviolet light includes the steps of providing an optical surface 22 and providing a silicon oxyhalide film preform precursor 24. The method includes forming an optical coating 26 on optical surface 22 with optical coating 26 formed from silicon oxyhalide film preform precursor 24.

Providing silicon oxyhalide film preform precursor 24 preferably includes providing a silicon oxyhalide film preform glass solid. More preferably the silicon oxyhalide film preform glass is a crushed solid glass of silicon oxyfluoride glass. Preferably the silicon oxyhalide film preform glass is provided from a silicon oxyhalide glass member bulk object such as a plate, tube, or macro piece which is physically transformed into a more useable physical state such as by grinding, crushing, pulverizing, or powderizing. Providing the silicon oxyfluoride film preform glass includes providing a silicon oxyfluoride glass with greater than 80%/cm bulk internal transmission at below 240 nm optical lithography wavelengths. Preferably the silicon oxyfluoride preform glass has an internal transmission of at least 80%/cm at 193 nm; an internal transmission of at least 80%/cm at 175 nm; and most preferably has a 157 nm internal transmission of at least 80%/cm. In a preferred embodiment of the invention the silicon oxyfluoride glass film preform 24 has a fluorine content of at least 0.1 weight percent, and preferably at least 0.1 to 2 weight percent. In the preferred embodiment the fluorine concentration of the silicon oxyfluoride glass is in the range from 0.1 to 2 wt. %. Preferably the silicon oxyfluoride glass has an OH content less than 50 ppm by weight, and more preferably no greater than 10 ppm by weight OH. Additionally silicon oxyfluroide glass 24 preferably has a chlorine content below 5 ppm by weight. In a preferred embodiment silicon oxyfluoride glass 24 consists essentially of Si, O and F. Such preferred compositions of silicon oxyfluoride glass provide beneficial optical lithography light transmission and result in beneficial silicon oxyfluoride optical coatings.

Formed optical coating 26 preferably comprises a silicon oxyfluoride glass film formed from the precursor 24. Forming optical coating 26 preferably includes forming a silicon oxyfluoride film with a fluorine content of at least 0.05 weight percent. In a preferred embodiment optical silicon oxyfluoride coating 26 has a fluorine content from 0.1 to 2 weight percent. Forming optical coating 26 preferably includes forming a silicon oxyfluoride glass coating with an OH content below 50 ppm by weight, and more preferably with OH≦10 ppm by weight. Preferably optical coating 26 also has a chlorine content ≦5 ppm by weight. In a preferred practice of the invention, silicon oxyfluoride optical coating 26 consists essentially of Si, O and F and is formed from a silicon oxyfluoride glass film preform 24 that consists essentially of Si, O and F. Providing silicon oxyhalide film preform 24 preferably comprises providing a silicon oxyfluoride film preform glass which has a fluorine content of 0.1 to 2 wt. % and forming optical coating 26 preferably comprises forming a silicon oxyfluoride coating which has a fluorine content of 0.05 to 1.5 wt. %.

The inventive method of forming silicon oxyhalide optical coating 26 on an optical surface 22 of optical lithography element E from silicon oxyhalide film preform precursor 24 results in a beneficial below 240 nm VUV optical lithography element E that manipulates below 240 nm optical lithography light. Forming optical coating 26 on optical surface 22 includes forming an optical coating with a packing density greater than 0.9 packing density. Forming optical coating 26 with a packing density >0.9 preferably includes forming an optical coating with a packing density ≧0.95, more preferably ≧0.99. Such high packing densities are provided by utilizing glass film preform precursor 24 and forming the optical coating therefrom as a non-crystalline film. Forming optical coating 26 includes forming the coating as a non-crystalline amorphous film, preferably with such high packing densities ≧0.9. In a preferred embodiment the formed optical coating non-crystalline amorphous film has an internal transmission of at least 80%/cm at UV lithography light wavelengths below 200 nm. Preferably formed optical coating 26 is damage resistant to below 200 nm lithography light exposure and provides a superior lithography element E.

As shown in FIG. 1, forming optical coating 26 includes forming a vacuum and depositing the optical coating on optical surface 22 in the vacuum. Forming a vacuum for deposition of optical coating 26 is provided by vacuum pump 28. Forming the optical coating deposition vacuum preferably includes forming a vacuum level of at least $1 \times 10^{-3}$ millibars (mbar), and more preferably at least $3 \times 10^{-4}$ millibars. Depositing optical coating 26 preferably includes vapor depositing the optical coating onto optical surface 22 from film preform 24. In a preferred practice of the invention the method includes providing an optical film deposition vacuum chamber 30, evacuating the vacuum chamber to form an evacuated vacuum atmosphere containing optical surface 22 and silicon oxyhalide film preform 24, vaporizing silicon oxyhalide film preform 24 and depositing a film from the vaporized silicon oxyhalide preform onto optical surface 22 to form optical coating 26. Preferably the chamber is evacuated to a vacuum level of at least $1 \times 10^{-3}$ millibars (mbar), and more preferably at least $3 \times 10^{-4}$ millibars.

Figure 4:
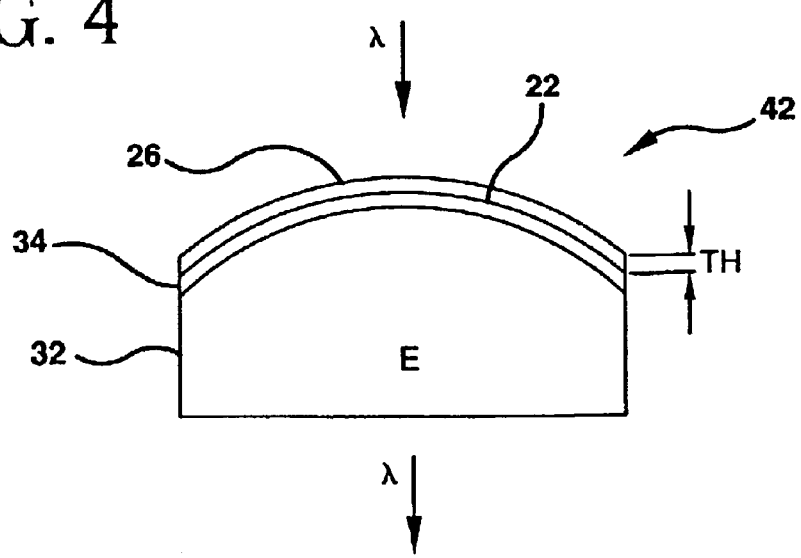
FIG. 4 is a side cross section view of an embodiment of the invention.

Providing optical surface 22 includes providing an optical substrate 32. An embodiment of the invention is shown FIG. 2, wherein optical coating 26 is formed directly on optical surface 22 provided by optical substrate 32 of optical element E. With such an embodiment the silicon oxyhalide film optical coating is directly deposited on the optical surface of the optical element substrate with no intervening optical films between the two. A further embodiment of the invention is shown in FIG. 4 where providing the optical surface 22 includes providing a deposited optical film 34 on an optical substrate 32. Provided optical surface 22 can be provided with at least one or more optical intervening material films between the optical surface and optical substrate.

Forming silicon oxyhalide optical coating 26 an optical lithography element E includes the forming of optical films for manipulating below 240 nm optical lithography light. In a preferred embodiment forming the optical coating comprises forming a thin transparent optical interference film for controlling reflection of incident radiation. In a further embodiment the invention includes forming a thin transparent optical interference film for controlling transmission of incident radiation. In an alternative embodiment forming the optical coating includes forming a thin transparent optical interference film for separating a wavelengths of incident radiation. In a further alternative the formed optical coating can be a thin transparent optical interference film for dividing the amplitudes of incident radiation. Also forming the optical coating can include forming a thin transparent optical interference film for separating the polarization states of incident radiation. With such optical coating for manipulating incident light radiation the formed silicon oxyhalide optical coating 26 either as a sole thin film coating or combined with other thin film coating layers is utilized to optically manipulate the light of the optical system.

The step of providing an optical surface 22 includes providing a lithography element E. Optical surface 22 on which the silicon oxyhalide coating 26 is formed may be an actual surface of the lithography element material substrate or may be a deposited optical surface thin film material which is directly or indirectly supported by the lithography element material. In an embodiment of the invention providing optical surface 22 includes providing a silica glass optical substrate lithography element, preferably with optical element E being comprised of a high purity fused $SiO_2$ glass with greater than 80%/cm transmission at a lithography wavelength below 240 nm. In the preferred embodiment providing optical surface 22 includes providing a fluoride crystal optical substrate lithography element, with fluoride crystal optical element E most preferably being a calcium fluoride crystal. In a further embodiment optical coating 26 may be utilized with a fluoride crystal element such as magnesium fluoride.

Figure 5:
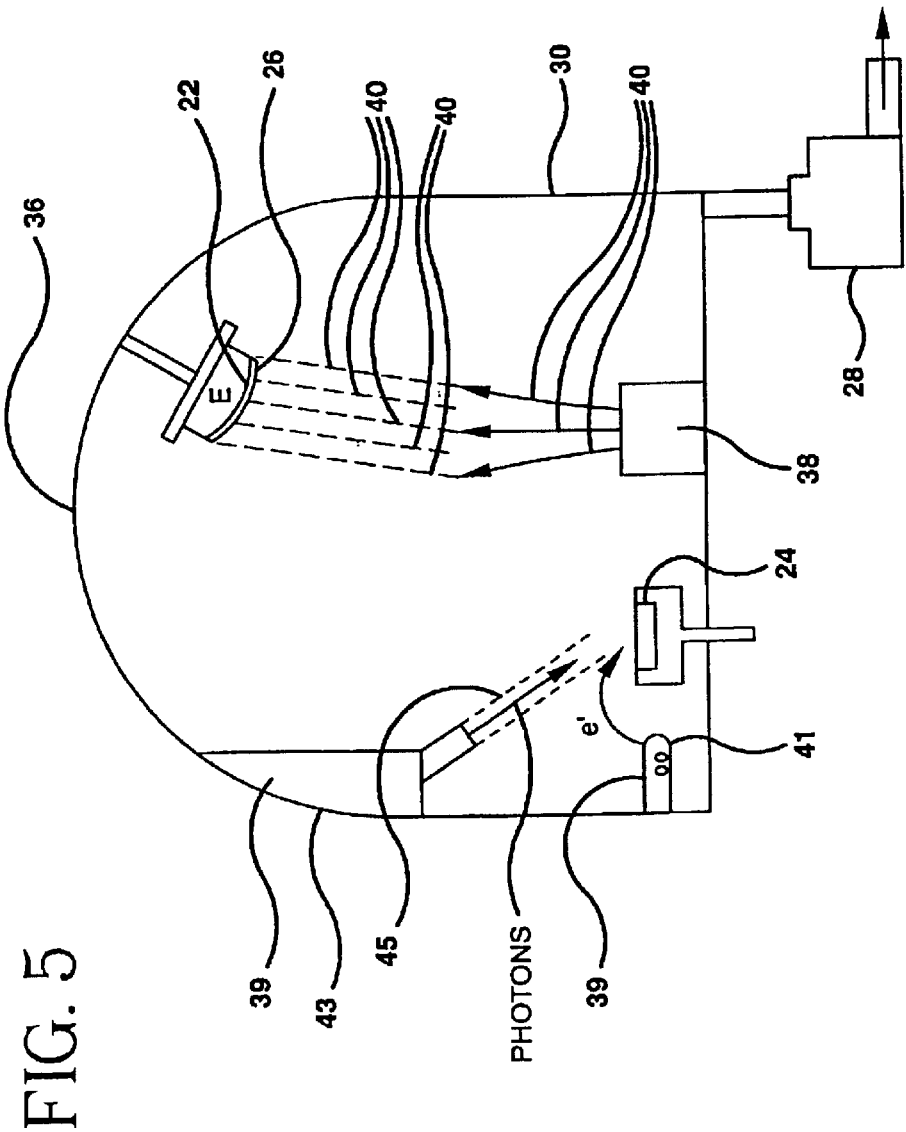
FIG. 5 shows a method of the invention.
Figure 5A:
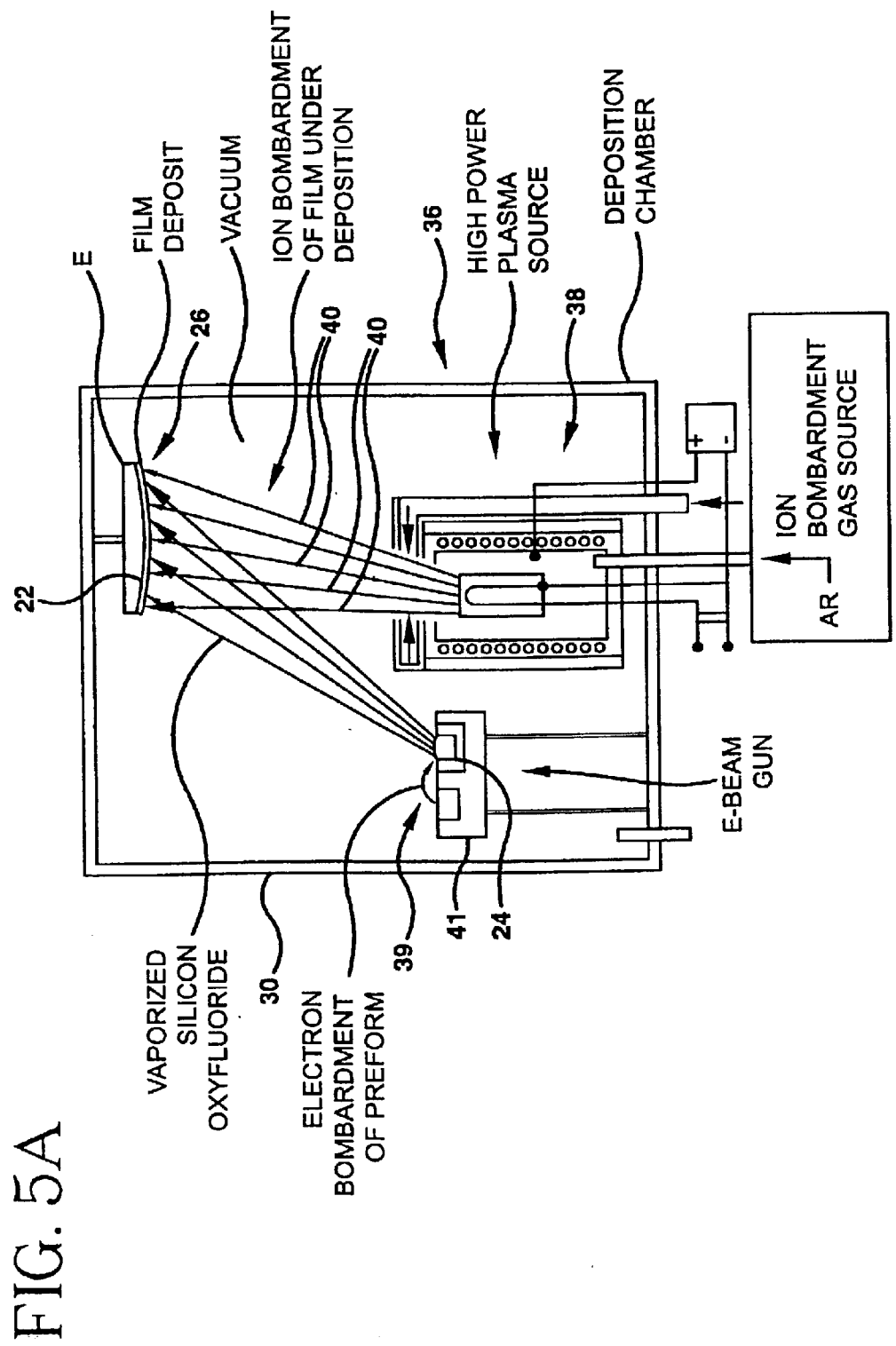
FIG. 5a shows a method of the invention.

As shown in FIGS. 5 and 5a, a preferred practice of the invention utilizes energetic ion bombardment in the formation of optical coating 26 from the provided silicon oxyhalide film preform precursor. Energetic ion bombarding of the silicon oxyfluoride film forming on surface 22 provides a beneficial silicon oxyfluoride optical coating 26. In such a practice an optical film energetic ion bombardment deposition chamber 36 is utilized. Energetic ion source 38 produces energetic ions 40 which bombard the deposited silicon oxyhalide film on surface 22 to result in an ion bombarded deposited coating 26 on surface 22.

The formation of optical coatings 26 on optical surfaces 22 may include the heating of the optical surface and substrate optical element E. In an alternative formation of optical coating 26, the optical surface 22 and the element E is unheated.

In the preferred embodiment of the invention, the provided silicon oxyhalide film preform precursor and resultant optical coating are silicon oxyfluorides. Preferably providing a silicon oxyfluoride glass precursor and forming an optical coating comprises providing a silicon oxyfluoride glass 24 with a fluorine content FB and forming an optical coating 26 which has a fluorine content FA with FA>0.25 FB. More preferably the provided silicon oxyfluoride glass 24 has a fluorine content FB and optical coating 26 is formed with a fluorine content FA with FA≧0.35 FB. With such fluorine concentration retained in the optical coating 26 formed from the silicon oxyfluoride glass 24, beneficial optical coating characteristics are achieved, particularly with high transmission and damage resistance to the lithography light. A preferred optical coating 26 is produced when approximately half of the fluorine concentration of the film preform precursor is incorporated into the formed optical coating.

The method of making an optical lithography device preferably includes providing an optical surface having a hardness S and forming an optical coating having a hardness H wherein hardness H is greater than hardness S. This provides a protective overcoating to the underlying optical surface while also providing advantageous optical properties such as transparency at below 240 nm wavelengths. In a preferred embodiment a silicon oxyfluoride optical coating with a hardness H is formed which has a measured transmission at below 240 nm optical lithography wavelengths greater than 80% and protects the more delicate underlying optical surface and materials from environmental dangers. The step of forming a silicon oxyfluoride coating preferably includes forming a mechanical scratch resistant coating that is a protective dense overcoating. In addition the silicon oxyfluoride coating having a hardness H greater than the underlying optical surface hardness S, the formed coating preferably has a high packing density, with the high packing density greater than the packing density of the underlying optical surface. In addition to the silicon oxyhalide coating providing structural mechanical protection from physical harm and environmental dangers, the protective coating preferably provides the lithography element with contamination protection in later lithography element manufacturing steps and use in optical lithography systems. In a preferred embodiment the provided optical surface is hygroscopic and the provided silicon oxyhalide glass film preform is non-hygroscopic. With such the formed protective silicon oxyhalide coating protects the underlying optical materials that are susceptible from attack by water and water vapor. In the most preferred embodiment the formed silicon oxyfluoride coating has a measured transmission at below 240 nm optical lithography wavelengths that is greater than 80% and inhibits the intrusion of environmental contaminants into the optical element E. The silicon oxyfluoride protective coating inhibits contamination by contaminants found in the manufacturing and use of the element which includes $H_2O$, hydrocarbons, organic molecules, and below 240 nm absorbing vapors. It is also preferred that the formed optical coating 26 has a porosity NP and the provided optical surface has a porosity P with P>NP. A formed optical coating from a non-porous below 240 nm 80%/cm transmitting silicon oxyfluoride glass film preform provides a protective non-porous optical overcoating which is highly transmitting to below 240 nm optical lithography wavelengths and resistant to contamination in optical lithography element manufacturing and use environments.

In a preferred embodiment of the invention providing an optical surface 22 includes providing optical substrate 32, forming a vacuum, preferably at least $1 \times 10^{-3}$ mbar, depositing an intervening optical fluoride film 34 on the substrate in the vacuum to form optical surface 22, and then maintaining the vacuum while forming optical coating 26 on the deposited fluoride film optical surface 22, preferably with optical coating 26 having a packing density $\geq 0.9$. Most preferably the formed optical coating 26 is a silicon oxyfluoride non-crystalline amorphous coating, which preferably has a packing density $\geq 0.95$. With such a process durable optical lithography elements can be produced which utilize fluoride films with small crystallites which have excellent optical lithography properties and are resistant to contamination and laser damage.

In a further aspect the invention includes a below 240 nm optical lithography device. The below 240 nm optical lithography device for manipulating below 240 nm wavelength optical lithography light radiation having a wavelength band centered about λ is designated in FIGS. 2 and 4 as lithography device 42. Optical lithography device 42 includes optical lithography element body E which is an optical lithography medium having a λ internal transmission of at least 80%/cm. Optical lithography coating 26 overlays optical lithography element body E and is a silicon oxyfluoride film which has a 50% transmission short cutoff wavelength that is less than λ. At wavelength λ, the silicon oxyfluoride is transparent and has a transmission greater than 50%, with the short cutoff wavelength of the optical coating occurring at a wavelength shorter than λ.

Optical coating 26 is preferably a vapor deposited silicon oxyfluoride film formed in accordance with the inventive methods. In a preferred embodiment, the silicon oxyfluoride film has a fluorine content of 0.1 to 2 weight percent, and most preferably consists essentially of Si, O and F. Preferably optical coating silicon oxyfluoride film 26 has a fluorine content of at least 0.05 weight percent, more preferably $\geq 0.1$ wt. %, more preferably $\geq 0.3$ wt %, and most preferably $\geq 0.4$ wt. %. Preferably optical coating silicon oxyfluoride film 26 has an OH content below 50 ppm by weight, and more preferably $\leq 10$ ppm. Preferably the silicon oxyfluoride film has a chlorine content below 5 ppm by weight.

With optical device 42, the optical thickness TH of silicon oxyfluoride film optical coating 26 correlates to the wavelength band centered about λ, with the physical thickness of the silicon oxyfluoride film optical coating being in the order of about λ. As shown in FIGS. 2 and 4, the silicon oxyfluoride film has an optical thickness designated as TH, with TH equal to the optical refractive index n of the silicon oxyfluoride film multiplied by the physical thickness t of the silicon oxyfluoride film. Preferably the thickness TH of the silicon oxyfluoride film is less than 2 λ, and more preferably TH<λ. In an embodiment of the silicon oxyfluoride film the thickness TH=(1/N)λ where N is a whole number greater than one, preferably with N=4. In a preferred practice of the invention, the silicon oxyfluoride film has a thickness TH=P (λ/4) where P is a whole number greater than 0. With such thickness of optical coating 26 correlating with and on the order of λ, beneficial manipulation of the below 240 nm optical lithography light can be achieved with constructive and destructive interference. In a preferred embodiment the thickness TH=λ/2 wherein reflections are minimized, and preferably the λ/2 thickness also protects the more fragile underlayments that it overlays. In an alternative embodiment the thickness TH of the silicon oxyfluoride film is greater than 2 λ.

In accordance with the invention, silicon oxyfluoride film optical coating 26 is vapor deposited from a silicon oxyfluoride glass 24 and formed on optical surface 22. Preferably silicon oxyfluoride film 26 is a vapor deposited film that is vapor deposited from a silicon oxyfluoride glass preform that has an internal transmission of at least 80%/cm at 193 nm, and more preferably an internal transmission of at least 80%/cm at 157 nm. In a preferred embodiment of the invention the wavelength λ is 193 nm, with the wavelength band including the below 240 nm optical lithography light wavelengths produced by an ArF excimer laser. In a further preferred embodiment the wavelength λ is 157 nm, with the wavelength band including the below 240 nm optical lithography light wavelengths produced by an $F_2$ excimer laser.

In a preferred embodiment optical lithography element body medium E is a fluoride crystal, and more preferably is a calcium fluoride crystal. In an alternative preferred embodiment, the optical lithography element body medium is comprised of Si, and more preferably comprised of $SiO_2$. With such an embodiment element E is a silica glass element, and for short wavelengths such as λ=157 nm, element E is preferably comprised of a silicon oxyfluoride glass.

In a preferred embodiment of the invention device 42 includes at least a second film, with the second film being in addition to silicon oxyfluoride film 26. Preferably the additional films are intervening films between silicon oxyfluoride film 26 and element E, as depicted in FIG. 4 by at least second film 34. Optical device 42 can contain a multitude of thin films such as a dielectric stack, which can include more than one silicon oxyfluoride film.

In a further aspect the invention includes a method of making an optical element for manipulating below 250 nm light. The method includes providing an optical element surface for manipulating below 250 nm photons, providing a silicon oxyfluoride glass, vaporizing the provided silicon oxyfluoride glass, and depositing the vaporized silicon oxyfluoride glass on the optical element surface. Vaporizing the provided silicon oxyfluoride glass includes energizing the glass 24 to produce silicon oxyfluoride forming vapors. Preferably the glass 24 is energized and vaporized with an energizer 39. FIG. 5 shows two types of energizers 39. FIG. 5a shows the preferred electron bombardment energizer and method of the invention. A preferred energizer 39 is a electron $e^-$ bombardment source 41 such as an electron source filament which produces electrons which are guided by electromagnetic fields. An alternative energizer 39 is a vaporizer laser beam source 43 which produces an energizing vaporizing laser beam 45 which irradiates glass 24. As shown in FIGS. 5 and 5a, in a preferred embodiment of the method vaporizing and depositing includes energetic ion bombarding the silicon oxyfluoride film 26 deposited on surface 22 of element E, preferably with glass 24 vaporized by electron bombardment. As shown in FIGS. 1 and 5, the method preferably includes maintaining a vacuum and depositing thin transparent optical interference silicon oxyfluoride film 26 on optical surface 22. A vacuum can be created inside chamber 30 and maintained using vacuum pump 28 to evacuate the vacuum chamber interior. The method also includes maintaining a vacuum and forming protective optical silicon oxyfluoride coating film 26 on optical surface 22, such as coating film 26 of FIGS. 2 and 4 which protect the underlying optical surface 22 and the underlying optical materials. The method can include heating the provided optical surface 22.

Providing silicon oxyfluoride glass 24 preferably includes providing a silicon oxyfluoride glass with a fluorine content of at least 0.1 weight %. Providing the silicon oxyfluoride glass preferably includes providing a silicon oxyfluoride glass with a 157 nm internal transmission of at least 80%/cm, more preferably $\geq 85\%$/cm. In a further preferred embodiment the provided silicon oxyfluoride glass has an internal transmission in the wavelength range of 157 nm to 175 nm of at least 80%/cm and more preferably transmission in the wavelength range of 157 nm to 175 nm of $\geq 85\%$/cm. Providing the silicon oxyfluoride glass preferably includes providing a silicon oxyfluoride glass which has an increase of absorption at 215 nm of less than 0.1 optical density ($\log_{10}$ transmission) per mm when exposed to at least $0.96 \times 10^6$ pulses of 157 nm wavelength containing $F_2$ excimer laser radiation at 4 mJ/cm²—pulse, and more preferably the 215 nm increase of absorption is less than 0.05 optical density. Providing silicon oxyfluoride glass 24 preferably includes providing a silicon oxyfluoride glass which has a coefficient of thermal expansion less than 0.55 ppm/° C. in the temperature range from room temperature to 300° C.

Providing silicon oxyfluoride glass 24 preferably includes providing a silicon oxyfluoride glass having an OH content less than 5 ppm by weight, a Cl content less than 5 ppm by weight, and a fluorine content of at least 0.1 weight %, with the glass having a 157 nm internal transmission of at least 80%/cm. Preferably the Cl content is less than 1 ppm. In a preferred embodiment the silicon oxyfluoride glass has a $H_2$ content of less than $1 \times 10^{17}$ molecules/cm³. In preferred embodiments the silicon oxyfluoride glass consists essentially of Si, O and F and the glass is essentially free of metal to metal Si—Si bonds. In a preferred embodiment the silicon oxyfluoride glass is free of a 165 nm absorbing center and has an internal transmission of 165 nm of at least 85%/cm.

Providing a silicon oxyfluoride glass includes providing a VUV cutoff wavelength lowered glass with minimal OH and the Cl content with a 50% transmission VUV cutoff wavelength below 160 nm. Preferably with the glass consisting essentially of Si, O and F and essentially free of Si—Si bonds. Preferably the fluorine content is in the range of 0.1 to 2.0 weight percent.

Preferably the provided silicon oxyfluoride glass is a VUV cut off wavelength lowered silicon oxyfluoride glass with a 50% transmission VUV cut off wavelength below 160 nm. Preferably the VUV cut off wavelength lowered glass has an OH content less than 1 ppm by weight and a chlorine content no greater than 25 ppm weight, and preferably has a fluorine concentration greater than about 0.1 wt. %.

Preferably providing a silicon oxyfluoride glass comprises providing a vaporizable silicon oxyfluoride film precursor preform glass target. Preferably the vaporizable silicon oxyfluoride film precursor preform glass target is a chlorine dried helium flushed silicon oxyfluoride glass, and more preferably a chlorine dried helium and fluorine flushed silicon oxyfluoride glass.

In an embodiment of the invention, providing a silicon oxyfluoride glass comprises providing a silicon oxyfluoride glass with an OH content of less than 50 ppm and a fluorine concentration greater than about 0.5 wt. %, preferably with OH content <5 ppm, and more preferably OH content <1 ppm. In an additional embodiment providing a silicon oxyfluoride glass comprises providing a silicon oxyfluoride glass with an OH content less than 10 ppm.

Figure 6A:
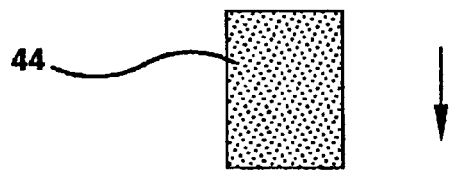
FIG. 6 shows a method of the invention.

In another aspect the invention includes a method of making a silicon oxyfluoride film precursor preform glass vaporization target for use as a silicon oxyfluoride source in the manufacture of silicon oxyfluoride film coatings. As shown in FIG. 6, the method of making the silicon oxyfluoride glass vaporizable target includes the steps of providing particles of $SiO_2$ 44, doping the particles with fluorine, and consolidating the particles to form a fused silicon oxyfluoride glass 46. Fused silicon oxyfluoride glass 46 comprises vaporizable silicon oxyfluoride film preform precursor 24 and is a vaporization target for forming a silicon oxyfluoride film. The method includes forming a vapor deposited film coating from the fused silicon oxyfluoride glass 46. Doping the particles with fluorine can be accomplished along with the providing and production of the particles and can also be accomplished prior to and during consolidation such as supplied from a dopant gas source.

Figure 6B:
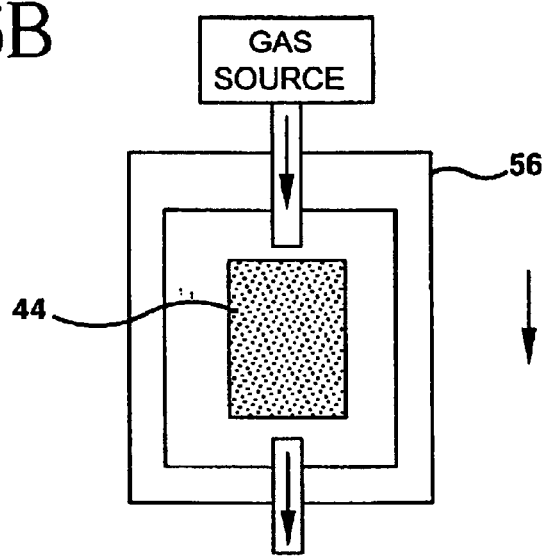
Figure 6C:
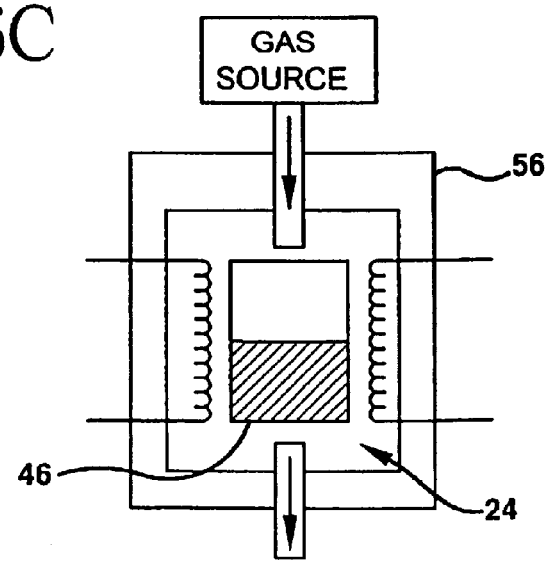
Figure 7:
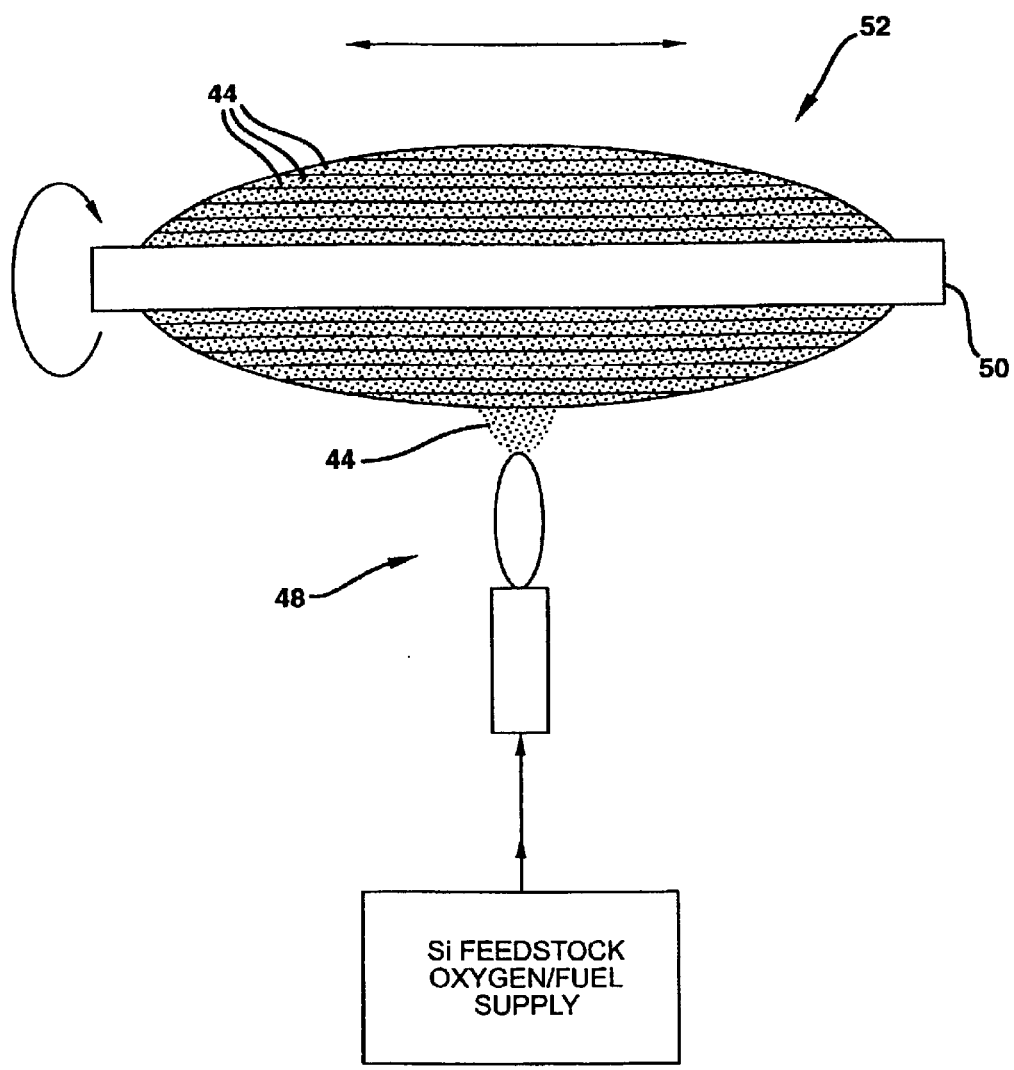
FIG. 7 shows a method of the invention.
Figure 8:
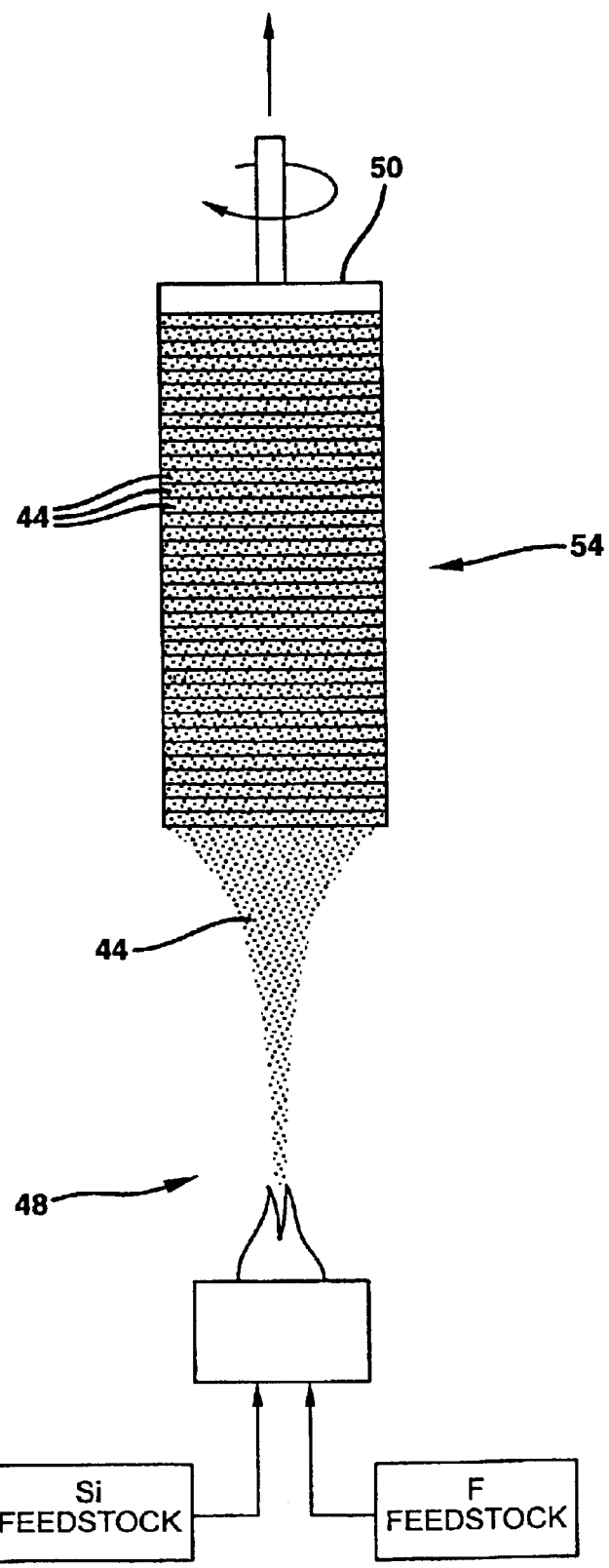
FIG. 8 shows a method of the invention.
Figure 9:
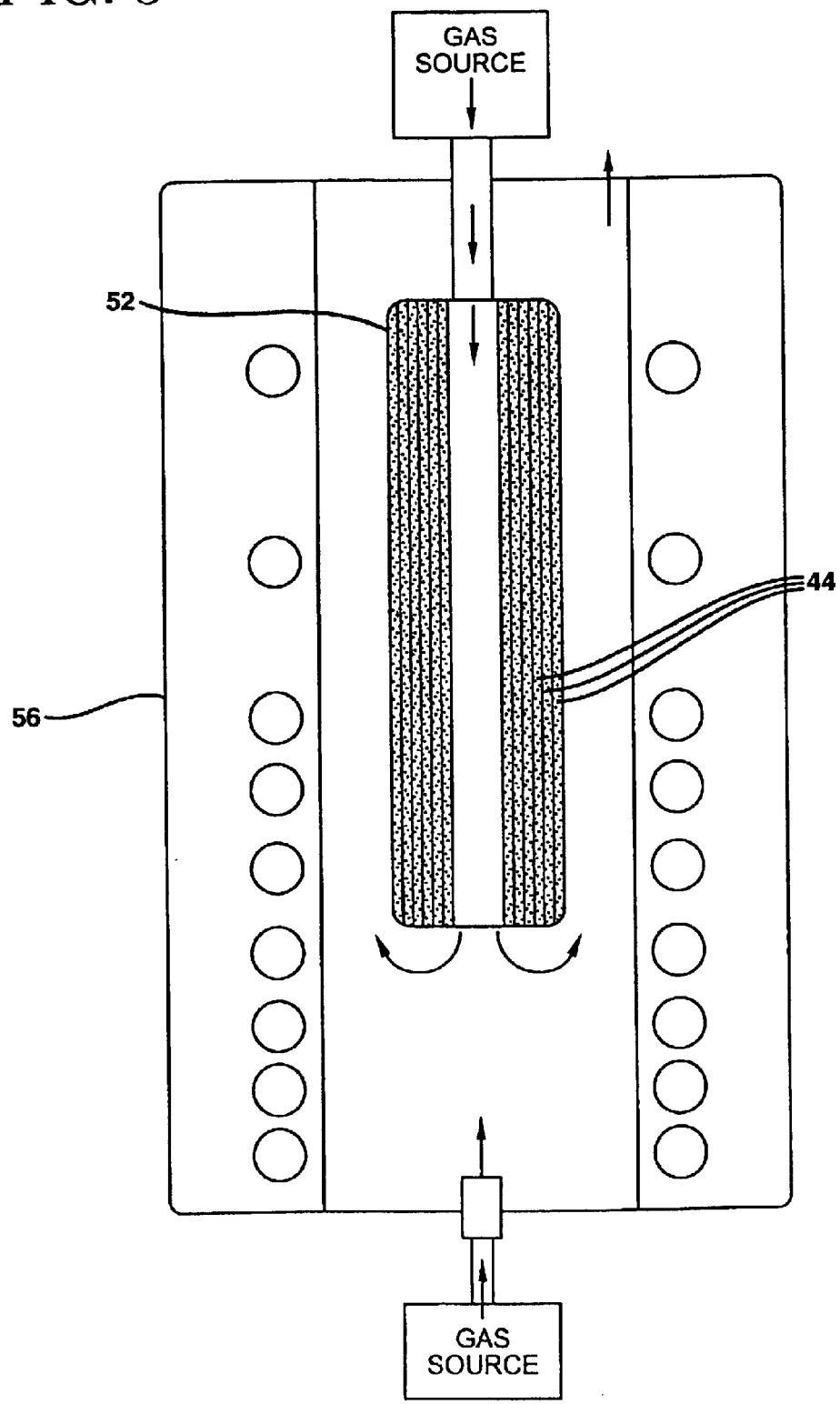
FIG. 9 shows a method of the invention.
Figure 10:
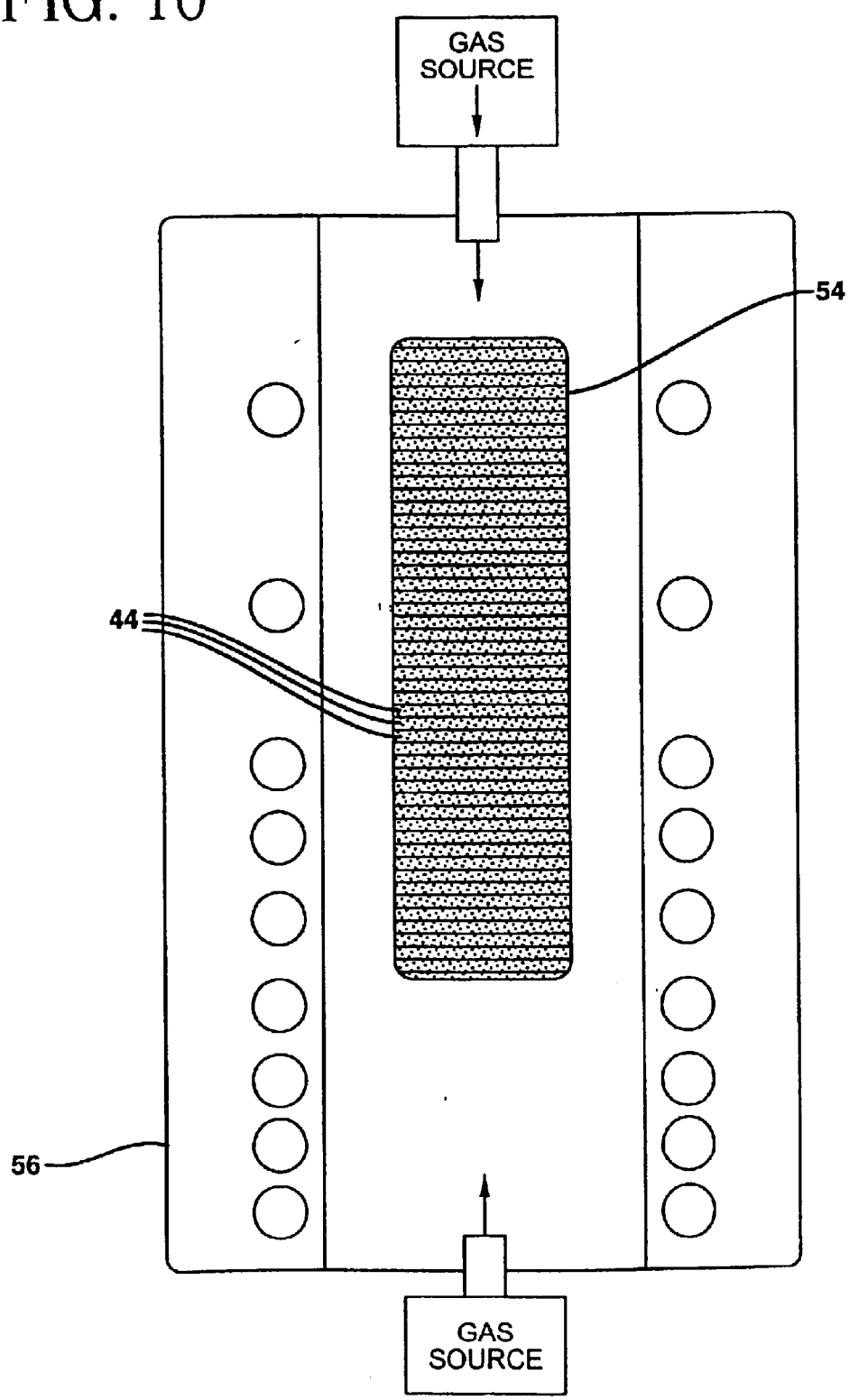
FIG. 10 shows a method of the invention.
Figure 11:
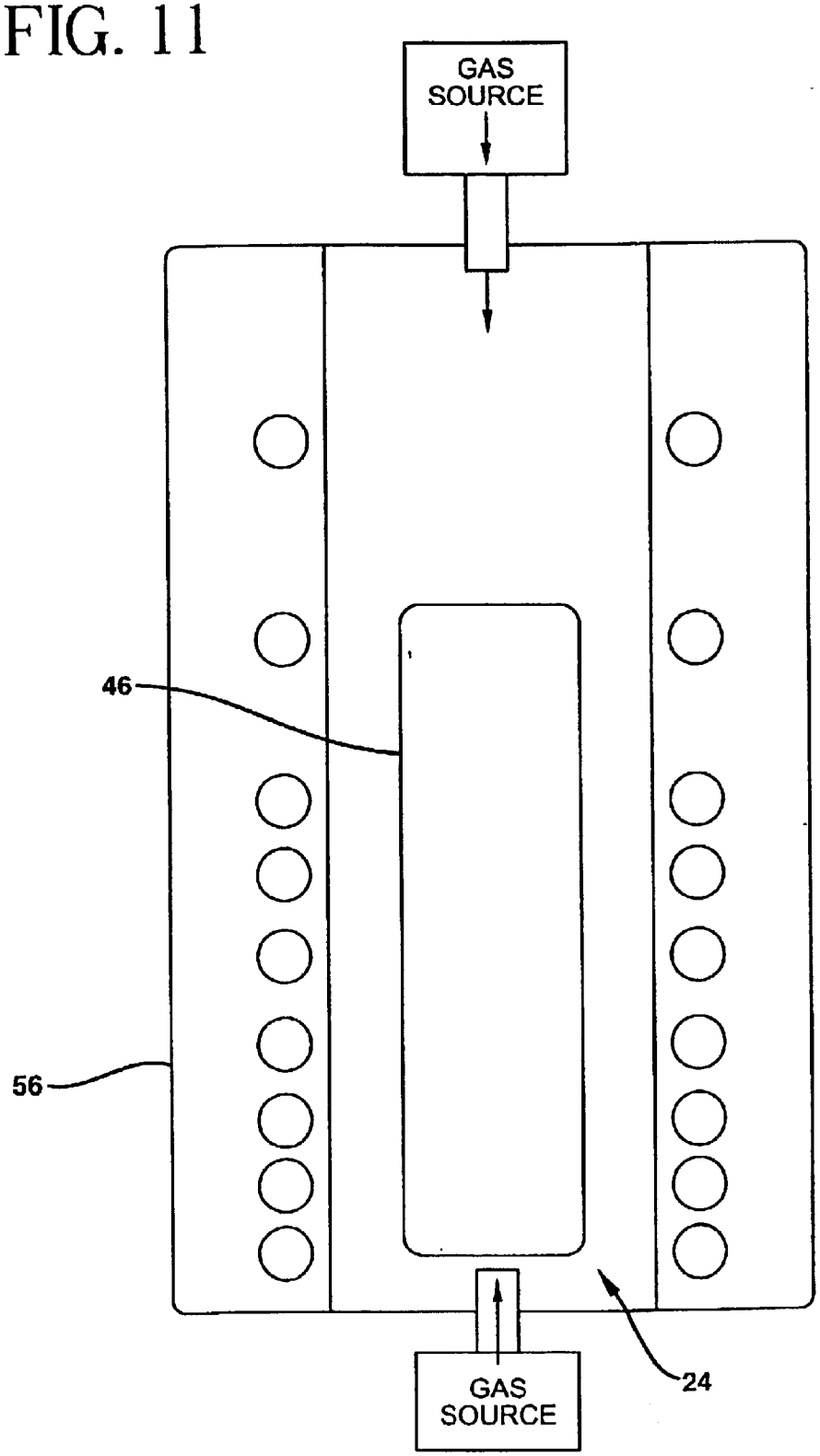
FIG. 11 shows a method of the invention.
Figure 12:
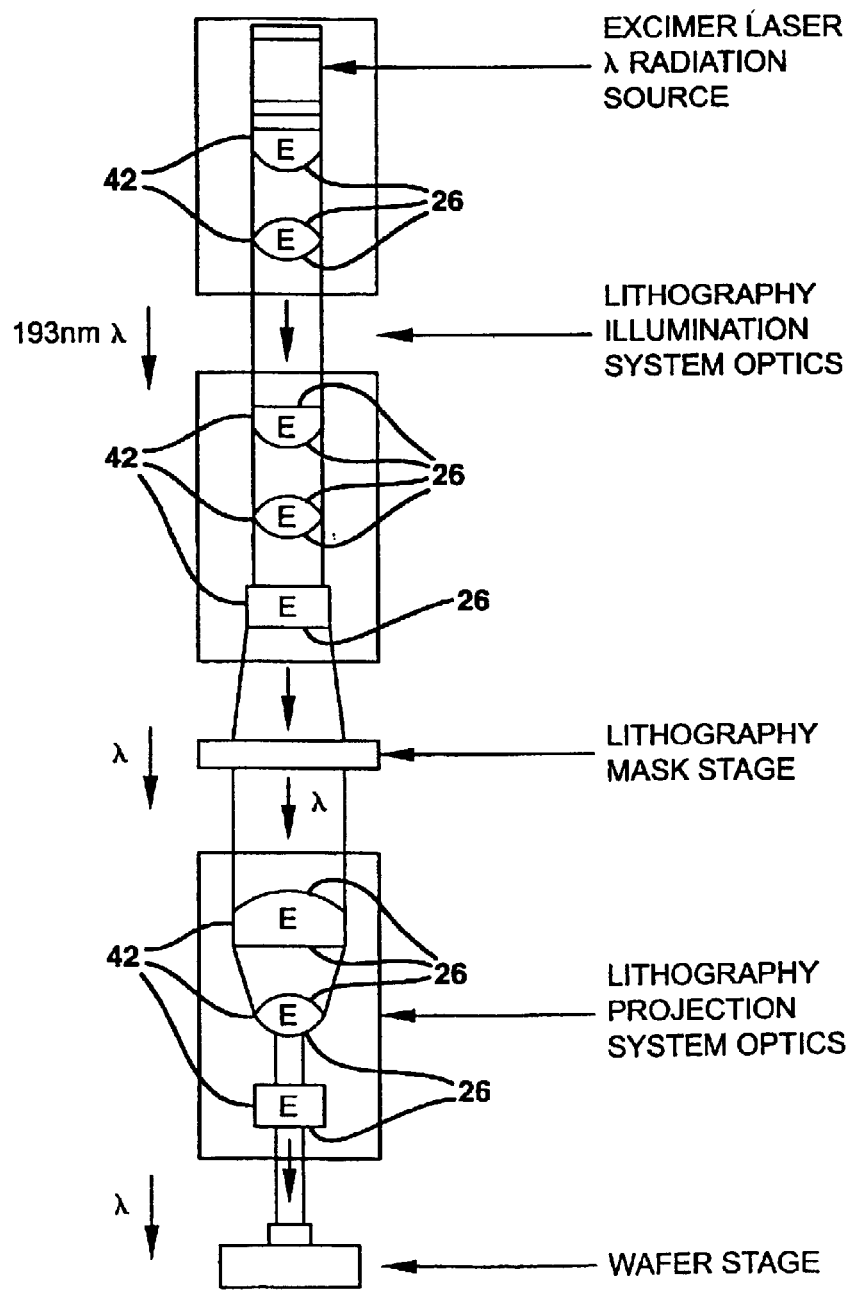
FIG. 12 shows a lithography method/system of the invention.
Figure 13:
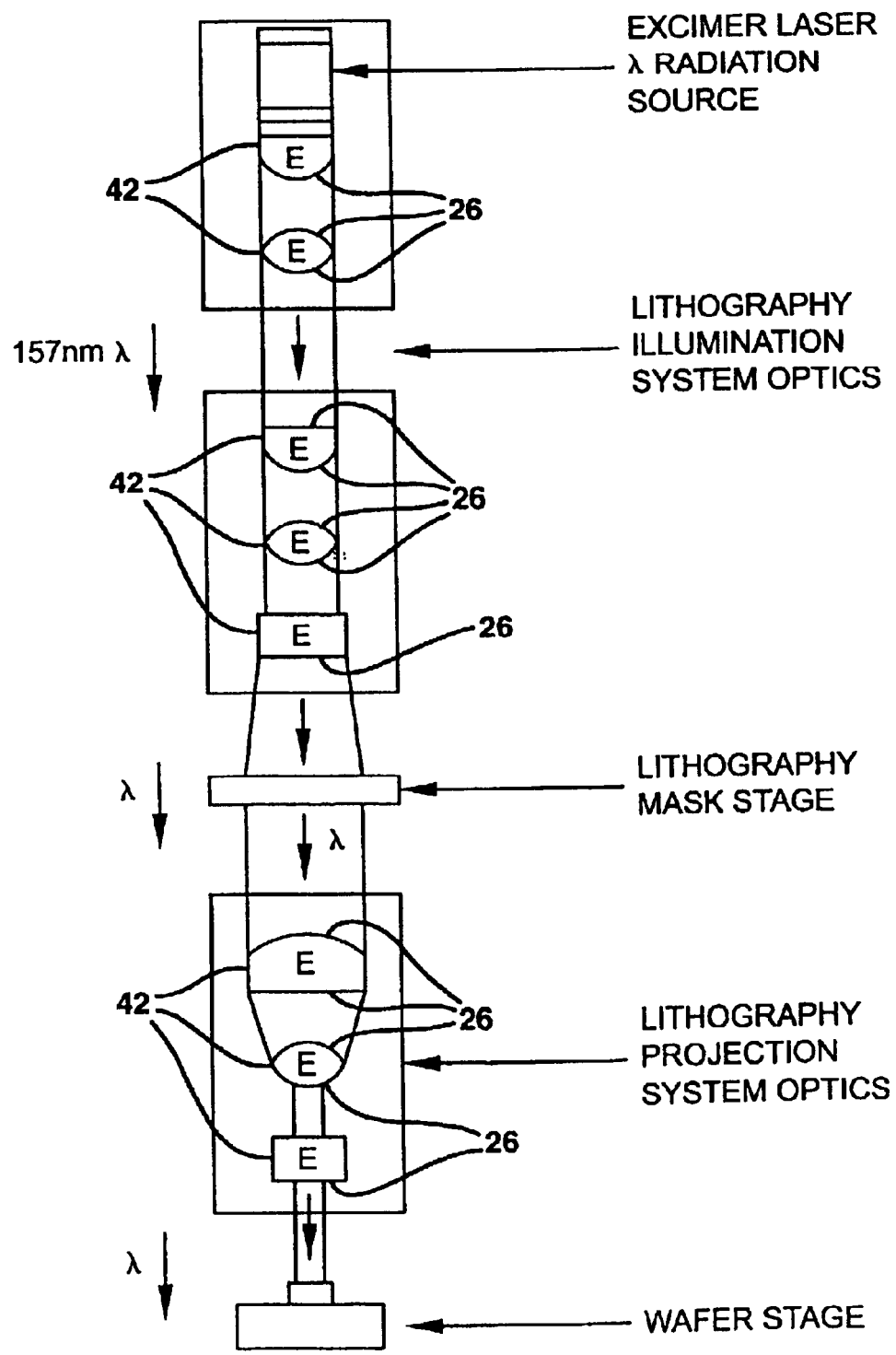
FIG. 13 shows a lithography method/system of the invention.

Providing particles 44 of $SiO_2$ preferably comprises delivering a Si containing feedstock to a conversion site and converting the Si containing feedstock into particles 44. FIGS. 7 and 8 disclose embodiments of providing particles 44. In FIG. 7, the Si containing feedstock is delivered to conversion site 48 and is converted in the conversion site reaction flame into $SiO_2$ soot particles 44 which are deposited and collected on substrate 50. In FIG. 7 translation motion and rotation of substrate 50 results in the formation of soot tube 52. Similarly, in FIG. 8, the Si containing feedstock is delivered to conversion site 48 and is converted in the conversion site reaction flame into SiO$_2$ soot particles 44 which are deposited and collected on particle substrate 50, with the rotation and withdrawing motion of substrate 50 resulting in the formation of soot column 54. As shown in FIG. 8, in an embodiment of the invention doping the particles 44 with fluorine includes delivering a F containing feedstock to conversion site 48 and doping the particles concurrently with converting the Si containing feedstock into particles 48. The Si containing feedstock and the F containing feedstock are converted in the conversion site reaction flame into F doped SiO$_2$ soot particles 44. In a further embodiment doping the particles with fluorine includes flooding the particles with a fluorine containing gas after the particles are produced and provided. As shown in FIG. 6b the particles 44 are preferably doped with fluorine supplied from an F-dopant gas source prior to consolidating in FIG. 6c. Preferably soot 44 is doped with the fluorine supplied by the gas source before and during consolidation into fused silicon oxyfluoride glass 46. In the method doping can be achieved concurrent with the formation of SiO$_2$ particles 44 as they are produced and also while the particles are sintered and consolidated into glass 46. The method of making fused silicon oxyfluoride glass 46 preferably includes dehydrating the particles. The method includes dehydrating the particles to provide a low OH oxyfluoride glass 46. Preferably the particles are dehydrated with a dehydrating gas supplied by a dehydrating gas source prior to doping with fluorine, preferably with the dehydrating gas comprised of a dehydrating chlorine containing gas. FIG. 9 shows an embodiment of the invention wherein a soot tube 52 is dehydrated with a dehydrating chlorine gas to remove OH from the SiO$_2$ soot, and then doped using a fluorine dopant gas prior to and during consolidation into a silicon oxyfluoride glass. Similarly in FIG. 10 soot column 54 is dehydrated with a dehydrating chlorine gas to remove OH from the SiO$_2$ soot and then doped using a fluorine dopant gas prior to and during consolidation. As shown in FIGS. 10–11, soot column 54 is consolidated by lowering into the high temperature zone of the furnace, preferably while the supply of fluorine dopant gas from the gas source is continued to result in a silicon oxyfluoride glass 46.

In a further aspect the invention includes a silicon oxyfluoride film precursor glass substrate for formation of a silicon oxyfluoride film. Silicon oxyfluoride film precursor preform 24 is comprised of a silicon oxyfluoride glass 45 which has a fluorine content of at least 0.1 weight percent and an internal transmission of at least 80%/cm in the wavelength range of 157 to 175 nm, and more preferably at least 85%/cm. Preferably the silicon oxyfluoride glass has an OH content <50 ppm by weight. Preferably the silicon oxyfluoride glass has a Cl content <50 ppm by weight. Preferably the film precursor glass has an increase of absorption at 215 nm of less than 0.1 optical density per mm when exposed to at least 0.96×10$^6$ pulses of 157 nm wavelength containing excimer laser radiation at 4 mJ/cm$^2$—pulse. Preferably the precursor glass is free of a 165 nm absorbing center and has an internal transmission of 165 nm of at least 85%/cm. Preferably the film precursor silicon oxyfluoride glass has a 435.8 nm refractive index $\leq$1.466, more preferably $\leq$1.465, and most preferably $\leq$1.464. Preferably the film precursor silicon oxyfluoride glass has a coefficient of thermal expansion less than 0.55 ppm/° C. in the temperature range from room temperature to 300° C. Preferably the film precursor silicon oxyfluoride glass has a 10$^{13.2}$ poise viscosity anneal point temperature less than 1000° C., more preferably less than 970° C., and most preferably less than 860° C. Preferably the film precursor glass has a 10$^{14.7}$ poise viscosity strain point temperature less than 850° C., more preferably less than 800° C., and most preferably less than 750° C. Such beneficial film precursor properties are preferably achieved with the silicon oxyfluoride glass's greater than 0.1 wt. % F concentration, and preferably with the glass's low OH and Cl levels. Preferably the glass has an OH content less than 10 ppm by weight, more preferably less than 5 ppm. Preferably the glass has a Cl content $\leq$25 ppm, more preferably $\leq$10 ppm, and most preferably $\leq$5 ppm. Preferably the F content is $\geq$1 weight percent, and most preferably the silicon oxyfluoride glass consists essentially of Si, O, and F.

Providing silicon oxyfluoride glass preferably includes providing a very dry high purity silicon oxyfluoride glass 46 with an OH content less than 50 ppm by weight, more preferably less than 10 ppm, and most preferably less than 1 ppm so that the glass is hydroxyl free. Such OH contents can be measured by measuring the 2.7 micron IR transmission of the glass. Such low OH silicon oxyfluoride glass is preferably obtained by dehydrating precursors of the glass before and during the transformation of the precursors into glass. In addition to such a low OH level, the provided silicon oxyfluoride glass is of very high purity so that the silicon oxyfluoride glass consists essentially of Si, O and F. It is preferred that the silicon oxyfluoride glass is chlorine free, and preferably has less than 10 ppm Cl, most preferably less than 1 ppm Cl. Such low Cl levels are preferably achieved by flushing out/replacement of Cl and exposure to F containing treatment atmospheres, particularly if the precursor soot is exposed to Cl, such as during dehydrating with Cl or is obtained from a chlorine containing silica feedstock. Preferably the silicon oxyfluoride glass has no absorption peak at 900 cm$^{-1}$ for Si—Cl. It is preferred that the silicon oxyfluoride glass is hydrogen free and has less than 1×10$^{17}$ H$_2$ molecules/cm$^3$, preferably less than 5×10$^{16}$ H$_2$ molecules/cm$^3$ more preferably less than 3×10$^{16}$ H$_2$ molecules and most preferably has no detectable hydrogen. Preferably the silicon oxyfluoride glass has no absorption peak at 4,100 cm$^{-1}$ for hydrogen.

It is preferred that the silicon oxyfluoride glass is essentially free of Si to Si bonds and 165 nm oxygen deficiency absorbing centers. Preferably the SiO$_2$ molecules and the glass are produced with stoichimetric or near stoichimetric levels of oxygen to minimize the formation of oxygen deficient Si to Si bonds. Preferably the glass has a 165 nm measured transmission of at least 75%, more preferably at least 80% and most preferably at least 85% per 5 mm thickness. Preferably the glass has a 157 nm internal transmission of at least 80%/cm and a 165 nm internal transmission of at least 85%/cm. More preferably the silicon oxyfluoride glass has a 157 nm internal transmission of at least 85%/cm and a 165 nm internal transmission of at least 90%/cm.

Preferably the silicon oxyfluoride glass does not exhibit a 215 nm absorption band after exposure to F$_2$ excimer radiation including the 157 nm wavelength. Most preferably a one mm thick piece of the silicon oxyfluoride glass after at least 0.96×10$^6$ pulses at 4 mJ/cm$^2$—pulse of F$_2$ excimer laser 157 nm radiation has less than a 0.01 optical density (log$_{10}$ transmission) per mm increase at 215 nm and also from 160 nm to 190 nm and more preferably less than 0.005 at 215 nm. Preferably the invention includes replacing any Si to Si bonds with Si to F bonds.

Figure 3:
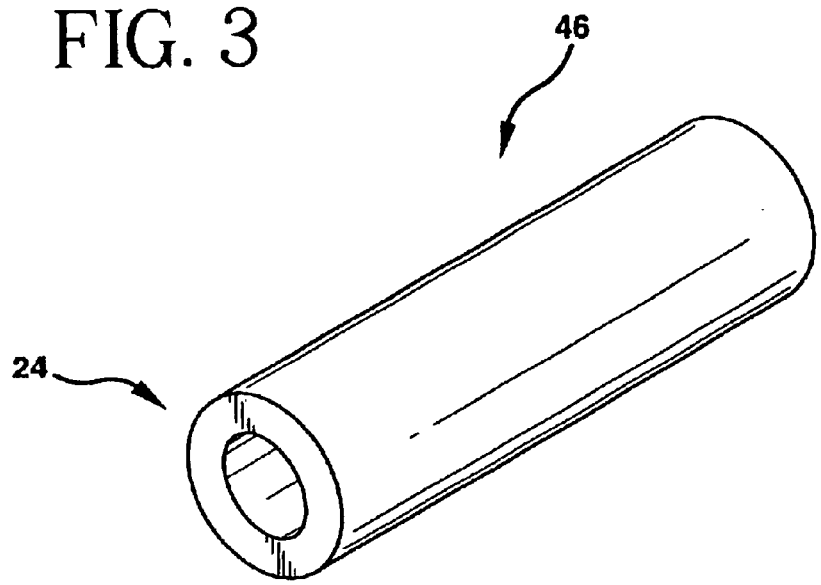
FIG. 3 is a perspective view of an embodiment of the invention.

A preferred silicon oxyfluoride glass tube 46 as shown in FIG. 3 is provided for by providing a SiO$_2$ soot tube 52 and dehydrating the SiO$_2$ soot tube to remove OH from the SiO$_2$ soot. In addition to dehydrating the SiO$_2$ soot tube, the method preferably includes replacing some of the silicon (Si) to oxygen (O) bonds with silicon (Si) to fluorine (F) bonds and consolidating the soot tube into a inclusion-free vitreous silicon oxyfluoride glass tube. Preferably the method includes replacing any Si to Si bonds with Si to F bonds. In the $SiO_2$ structure of the glass precursor and the vitreous glass, some of the $O^{2-}$ is preferably replaced with $F^-$ so that the silicate system of the resultant glass is somewhat depolymerized with a majority of the bonds in the glass being Si—O—Si bonds and a minority being Si—F bonds. As shown in FIG. 9, $SiO_2$ soot tube 52 is dehydrated, fluorine doped by the formation of Si—F bonds and consolidated in furnace 56. Appropriate treatment and source gases are supplied to consolidation furnace 56 through gas input from the gas sources, to affect dehydration (removal of OH with a dehydration treatment agent), incorporation of F (fluorine source doping gas) and preferably inclusion-free consolidation (preferably helium) of soot 44 into silicon oxyfluoride glass 46. Appropriate high purity treatment gases are used to treat precursor particles and provide an appropriate consolidation atmosphere for the particles. OH is removed from the $SiO_2$ particles and fluorine is incorporated into the precursor $SiO_2$ and the consolidating glass using dehydrating treatment gases, fluorine doping treatment gases, sintering treatment gases, dehydrating treatment temperatures, and fluorine doping treatment and sintering temperatures. Removing OH from $SiO_2$ includes heating the $SiO_2$ in a dehydrating atmosphere, which is maintained by supply of a dehydrating gas from the gas sources, preferably with a bottom and top input. Preferably the dehydrating atmosphere includes chlorine as a dehydrating gaseous agent. Preferred chlorine dehydrating gaseous agents are $Cl_2$, $SiCl_4$, and $CCl_4$, $SOCl_2$, with $Cl_2$ most preferred. In addition to the chlorine dehydrating gaseous agent, the majority of the dehydrating atmosphere by volume % (flow rate, partial pressure), is comprised of high purity helium. In a preferred method the dehydrating atmosphere also includes fluorine. The fluorine can be an additional dehydrating agent in the atmosphere such as with a chlorine/fluorine/helium dehydrating atmosphere or the fluorine can be the primary dehydrating agent such as a fluorine/helium dehydrating atmosphere with fluorine the minority by vol. %. Such a fluorine/helium dehydrating atmosphere is preferred in that chlorine contamination of the glass is minimized. Silicon fluoride, preferably $SiF_4$, is the fluorine dehydrating agent with $CF_4$ as an alternative, and $C_2F_6$ as an additional alternative fluorine dehydrating agent. $CF_4$ is a preferred drying/doping agent in that it provides improved drying compared with drying with $SiF_4$. $SiF_4$ is preferred for the fluorine doping because it gives a more uniform F profile than $CF_4$. Incorporating fluorine into the $SiO_2$ includes heating the $SiO_2$ in an atmosphere containing F, preferably at a fluorine doping treatment temperature greater than the dehydrating treatment temperature. The atmosphere containing F preferably includes silicon fluoride ($SiF_4$) as the F doping agent, with $CF_4$ as an alternative F doping agent. As with the dehydrating treatment atmosphere, helium preferably makes up the majority of the atmosphere. Preferably the supply of the F doping agent such as $SiF_4$ is continued while the $SiO_2$ is sintered and consolidated into the silicon oxyfluoride glass to insure proper incorporation of F into the glass and inhibit the removal of F from the glass. Preferably the soot is first dehydrated at a temperature in the range from preferably 900–1100° C. more preferably 1000–1100° C. such as with a $Cl_2$/helium atmosphere and a temperature of about 1100° C., then F doped at a temperature in the range from preferably 1125–1325° C. more preferably 1150–1250° C. such as with a $SiF_4$/helium atmosphere and a temperature of about 1225° C., then sintered in a sintering atmosphere in the range from preferably 1350–1550° C. more preferably 1450–1500° C. such as helium/$SiF_4$ atmosphere and a temperature of about 1450° C. The transition from the low dehydrating temperature, to the medium F doping temperature, to the high sintering temperature can be achieved by increasing the energy supplied to heating elements of the furnace, and is preferably achieved by moving the particles into a high temperature bottom zone in the consolidation furnace. It is preferred that the higher temperature zone is maintained at a higher temperature in the range from 1450–1500° C. for sintering. As an alternative to F doping after formation of the $SiO_2$ soot tube, F can be doped into the $SiO_2$ during the formation of the $SiO_2$ soot using a fluorine feedstock source. This is a preferred alternative of incorporating F into the $SiO_2$. Such fluorine doping during $SiO_2$ soot formation and deposition can be used as an alternative to subsequent fluorine doping steps when the fluorine doping level is sufficient and is maintained at a sufficient level through consolidation. In a preferred alternative embodiment fluorine doping during particle formation and deposition is utilized as a supplement/addition to subsequent fluorine doping steps. With fluorine doping at formation and then use of fluorine containing treatment atmospheres in subsequent process steps, elevated fluorine levels can be maintained based on equilibrium dynamics of fluorine content and presence prior to consolidation.

Glass 46 and film preform precursor 24 is preferably provided by first the removal of OH from $SiO_2$ particles 44, then fluorine is incorporated into the $SiO_2$ which is consolidated into a glass that contains at least 0.5 wt. % F, preferably with a fluorine weight % in the range from about 0.5 to about 2.5 wt. % F. Such fluorine levels can be achieved by consolidating the particles into a glass in an atmosphere containing F, or consolidating in a helium atmosphere after doping the soot with F. A preferred method of treating $SiO_2$ is OH removal by heating to a temperature in the range from 900 to 1100° C. in an atmosphere containing Cl, incorporating fluorine into the dehydrated $SiO_2$ by heating to a temperature in the range from 1125 to 1325° C. in an atmosphere containing F with F also displacing Cl, and then sintering the F doped particles at a temperature in the range from 1350 to 1550° C.

EXAMPLES

The silicon oxyfluoride glass of the invention preferably has very low levels of OH (<10 ppm wt. OH), very low trace levels of metal contaminants (<1 ppm wt.), low levels of molecular hydrogen ($H_2$<$5\times10^{+16}$ molecules/$cm^3$) and low levels of chlorine (Cl<10 ppm), and has a F wt. % content of 0.5–3 wt. %, so the glass is preferably provided by forming a soot which is then treated and consolidated to form the silicon oxyfluoride glass which can be further physically treated such as by crushing prior to coating formation.

The silicon oxyfluoride glass has a beneficial transmission of light in the below 193 nm vacuum ultraviolet lithography region centered around 157 nm. The preferred approach for consolidating a soot preform into a silicon oxyfluoride glass includes drying the porous $SiO_2$ particles in a He/$Cl_2$ atmosphere between 1000–1100° C. The particles are then heated in a helium fluorine doping atmosphere which includes a fluorine containing gas such as $SiF_4$ or $CF_4$ and at a temperature between 1150–1250° C. The amount of fluorine incorporated in the glass ([F]) is controlled by the partial pressure of the fluorine-containing gas (P) and the temperature (T) according to the relationship:

[F]=C×e$^{-E/RT}$×P$^{1/4}$ where C is a constant, R is the Gas Constant, and E is the Activation Energy for the reaction between the fluorine-containing gas and silica. The particles are then sintered by passing through a high temperature zone in the range of 1450–1500° C. in an atmosphere of helium or helium and the fluorine containing gas, with the atmosphere being free of chlorine so that inclusion of chlorine in the glass is inhibited. Such silicon oxyfluoride glasses have provided internal transmittances at 157 nm of about 84%/cm.

Figure 19:
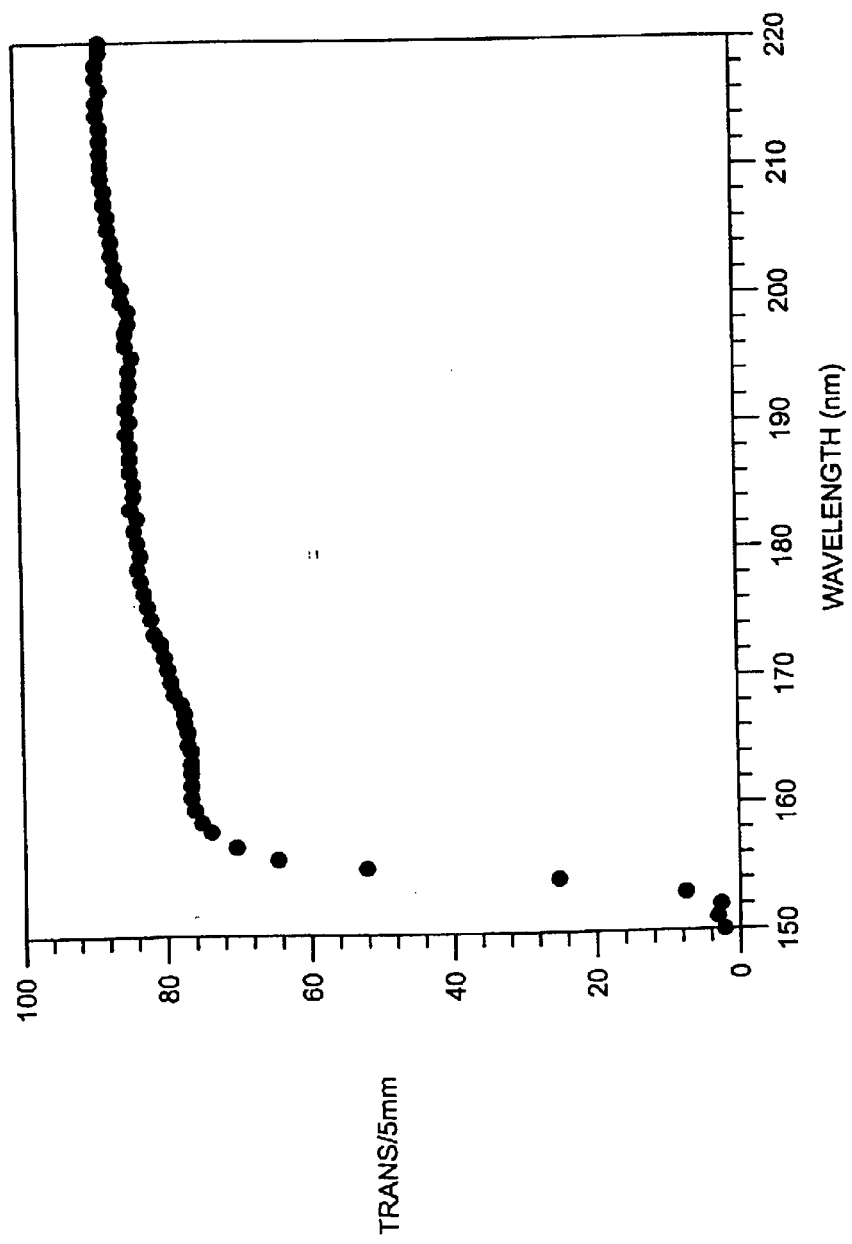
FIG. 19 is a transmission spectra plot of a silicon oxyfluoride glass in accordance with the invention with measured transmission % through a 5 mm sample vs. wavelength.

A fused silicon oxyfluoride glass 46 film preform precursor 24 was formed in accordance with the invention. As shown in FIG. 7 a soot tube 52 was formed by laying down soot $SiO_2$ particles 44 on an alumina rod particle substrate 50. Silicon tetrachloride was used as the Si feedstock and natural gas was the fuel for the conversion site burner flame. As an alternative to $SiCl_4$, silicon fluoride or a siloxane Si feedstock, such as octamethylcyclotetrasiloxane can be used as an Si feedstock and hydrogen can be used as a fuel instead of hydrocarbon gasses. The silica particles 44 where deposited with relative translation and rotation motion to result in soot tube 52. The particle substrate 50 was then removed from the soot tube to result in a hollow center. As shown in FIG. 9, the soot tube 52 was exposed to treatment gasses and consolidated in the consolidating furnace 56. The soot tube 52 was dehydrated with a dehydration treatment gas environment supplied by the gas sources. The soot tube was dehydrated at 1000° C. for 120 minutes with a dehydration treatment gas flow of 0.4 slpm Cl and 40 slpm He. The temperature was then ramped in 60 minutes to 1200° C. with a treatment gas flow of 2 slpm $O_2$ and 20 slpm He. It was then held at 1200° C. for 180 minutes with a fluorine doping treatment gas flow of 1.2 slpm $SiF_4$ and 18.8 slpm He. It was then sintered at 1480° C. by lowering into the bottom high temperature zone while the fluorine doping gas flow was maintained to result in a consolidated silicon oxyfluoride glass tube 46. The resultant silicon oxyflouride glass had a fluorine content of about 1.35 wt. % F and a chlorine content of less than about 25 ppm Cl by weight and a <1 ppm OH level. The glass tube was flattened and broken up to provide silicon oxyhalide film preform precursor 24. FIG. 19 shows the measured transmission VUV spectrum of the glass through a 5 mm thick sample. The silicon oxyfluoride film coating was formed in accordance with the method and apparatus shown in FIG. 5a. The silicon oxyhalide film preform precursor was vapor deposited onto an optical element optical surface to form a thin silicon oxyfluoride film coating. The film preform precursor was formed into a silicon oxyfluoride thin film coating on a high purity fused silica optical surface using energetic ion bombardment in a vacuum atmosphere of at least 1×10$^{-3}$ millibars (mbar) vacuum level. The vacuum coating deposition chamber system used was a computer controlled thin film optical coating system. The vacuum chamber thin film optical coating deposition system was a LEYBOLD SYSTEMS brand Model APS1104 precision optic coater deposition system from LEYBOLD SYSTEMS, Balzer and Leybold, Wilhelm-Rohn-Strasse 25 D-63450 Hanau, Germany. The coating was formed in a below 1×10(exp−3) mbar (millibar) vacuum, with the vacuum maintained at the preferred 3×10(exp−4) mbar level. The optical element E and its surface 22 was heated to a preferred deposition temperature of about 120 degrees C. Deposition can take place on heated or unheated optical element substrate surfaces with the temperature of the deposition surface ranging from 30 degrees C. to 250 degrees C., preferably about 120 degrees C. (100 to 140, more preferably 110 to 130 degrees C.). The energizing vaporizing heating of the film preform silicon oxyfluoride glass material 24 was accomplished via electron bombardment with an emission current of about 0.1 amp using a voltage of about 8.1KV in the preferred range from about 3KV to 10KV. The energized film preform silicon oxyfluoride glass material 24 evaporated to form a vapor in the vacuum space. The film 26 formed upon deposition at the optic surface 22 and was simultaneously bombarded by energetic ions produced by the plasma source. The accelerating voltage of these ions was about 140V which is in the preferred range from 40V to 170V. The resulting film was dense and non-porous in that it had a high packing density. The film was deposited with a deposition rate of about 0.25 nm/sec which is in the preferred range from 0.1 nm/sec to 10 nm/sec. The ions used for film bombardment were argon which is member of the preferred bombarding noble gases group. Oxygen is an alternative bombarding gas. Preferably the ion current at deposition is a few milli-amps per square centimeter.

X-ray photo-electrospectroscopy of the silicon oxyfluoride film coating showed that the optical coating had a fluorine content of about 0.5 wt. %. The formed silicon oxyfluoride film had low absorption at 157 nm and was laser power resistant and stable over time including over 200M pulses of 157 nm excimer radiation at 2 mJ/cm$^2$ and had a packing density approaching 1.0.

It was surprising and unexpected that such a large percentage of the fluorine in the film precursor was incorporated into the formed silicon oxyfluoride film, and that the film provided such beneficial optical transmission and laser damage resistance. Such retention of fluorine in a vapor deposited optical element film is particularly surprising in view that fluorine easily dissociates in the forming of fluorine containing optical thin films. In the forming of fluorine containing optical thin films such as magnesium fluoride, calcium fluoride, and lanthanum fluoride fluorine dissociation problems encumber the formation of beneficial optical films with the fluorine dissociating so readily that often free metal defective films are deposited that lack fluorine and only include the magnesium, calcium, or lanthanum.

Further silicon oxyfluoride glasses of the invention with 0 to 1.5 wt. % F were made using $SiO_2$ particle soot tubes. $SiO_2$ particle soot tubes 52 where chlorine-dried, fluorine-doped and sintered to provide the range of F concentrations. The soot tubes were chlorine dried at 1000° C., ramped to a doping temperature of about 1225° C. under He and exposed to $CF_4$/He gas mixtures at the doping temperature for 2–3 hours and then downfed into the furnace sinter zone under the $CF_4$/He gas mixtures. Fluorine concentrations of the glasses were measured using microprobe analysis. Refractive index measurements were made on prism shaped pieces of the glass. Thermal expansion measurements of the glasses were made on glass bars using a dilatometer. Viscosity measurements were made using a bending beam method with anneal point at the temperature at which 10$^{13.2}$ poise was measured and strain point at the temperature at which 10$^{14.7}$ poise was measured. Results are shown in the table below.

| wt. % F | 0% F | 0.17 wt. % F | 0.67 wt. % F | 0.8 wt. % F | 0.96% F | 1.12 wt. % F | 1.45% F | 1.48 wt. % F |
|---|---|---|---|---|---|---|---|---|
| Refractiv Index | | | | | | | | |
| 157.6 nm | | | | 1.654226 | | | | |
| 435.8 nm | 1.4671 | 1.466 | 1.4638 | 1.4634 | | 1.4618 | | 1.4604 |
| 480 nm | 1.4639 | 1.4628 | 1.4606 | 1.4603 | | 1.4586 | | 1.4573 |
| 546.1 nm | 1.4605 | 1.4594 | 1.4573 | 1.4569 | | 1.4553 | | 1.4539 |
| 589.3 nm | 1.4588 | 1.4578 | 1.4556 | 1.4552 | | 1.4537 | | 1.4524 |
| 632.8 nm | 1.4576 | 1.4568 | 1.4546 | 1.4542 | | 1.4529 | | 1.4515 |
| 643.8 nm | 1.4572 | 1.4561 | 1.4539 | 1.4536 | | 1.452 | | 1.4507 |
| 777 nm | 1.4533 | 1.4526 | 1.4502 | 104499 | | 1.4485 | | 1.4474 |
| 1300 nm | 1.4472 | 1.4461 | 1.4444 | 1.4436 | | 1.4423 | | 1.4411 |
| 1541 nm | 1.441 | 1.4433 | 1.4409 | 1.4405 | | 1.4393 | | 1.438 |
| CTE (300C-RT), ppm/C | 0.59 | | | 0.51 | | | 0.43 | |
| Mechanical | | | | | | | | |
| Young's Modulus Mpa | 73024 | 72011 | 69784 | 69267 | | 67923 | 65806 | 66213 |
| Shear Modulus Mpa | 31245 | 30907 | 29859 | 29645 | | 28991 | 28129 | 28170 |
| Poisson's Ratio calculated | 0.165 | 0.166 | 0.169 | 0.169 | 0.170 | 0.171 | 0.173 | 0.173 |
| Viscosity | | | | | | | | |
| Anneal Pt., C | 1094 | 964 | | | 850 | | 810 | |
| Strain Pt., C | 950 | 808 | | | 702 | | 663 | |

Figure 14:
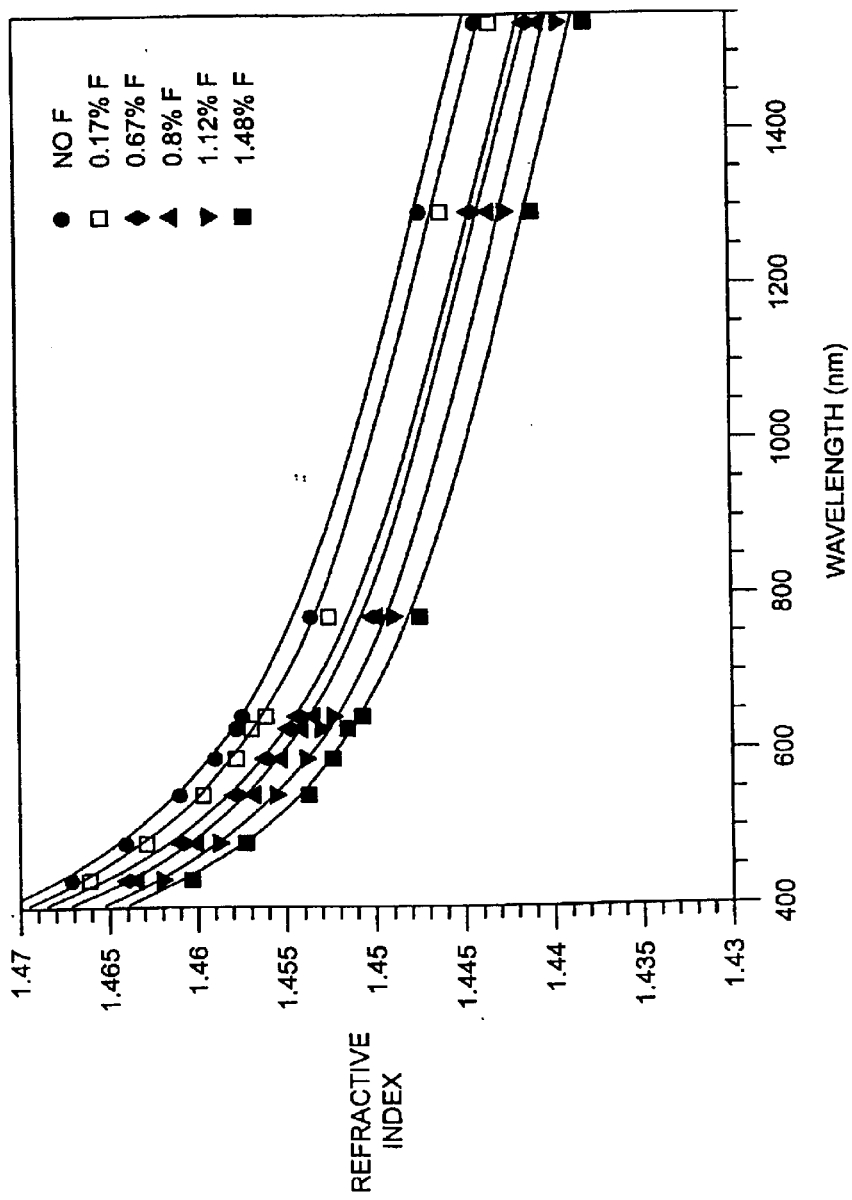
FIG. 14 is a plot of Refractive Index vs. wavelength in accordance with the invention.
Figure 15:
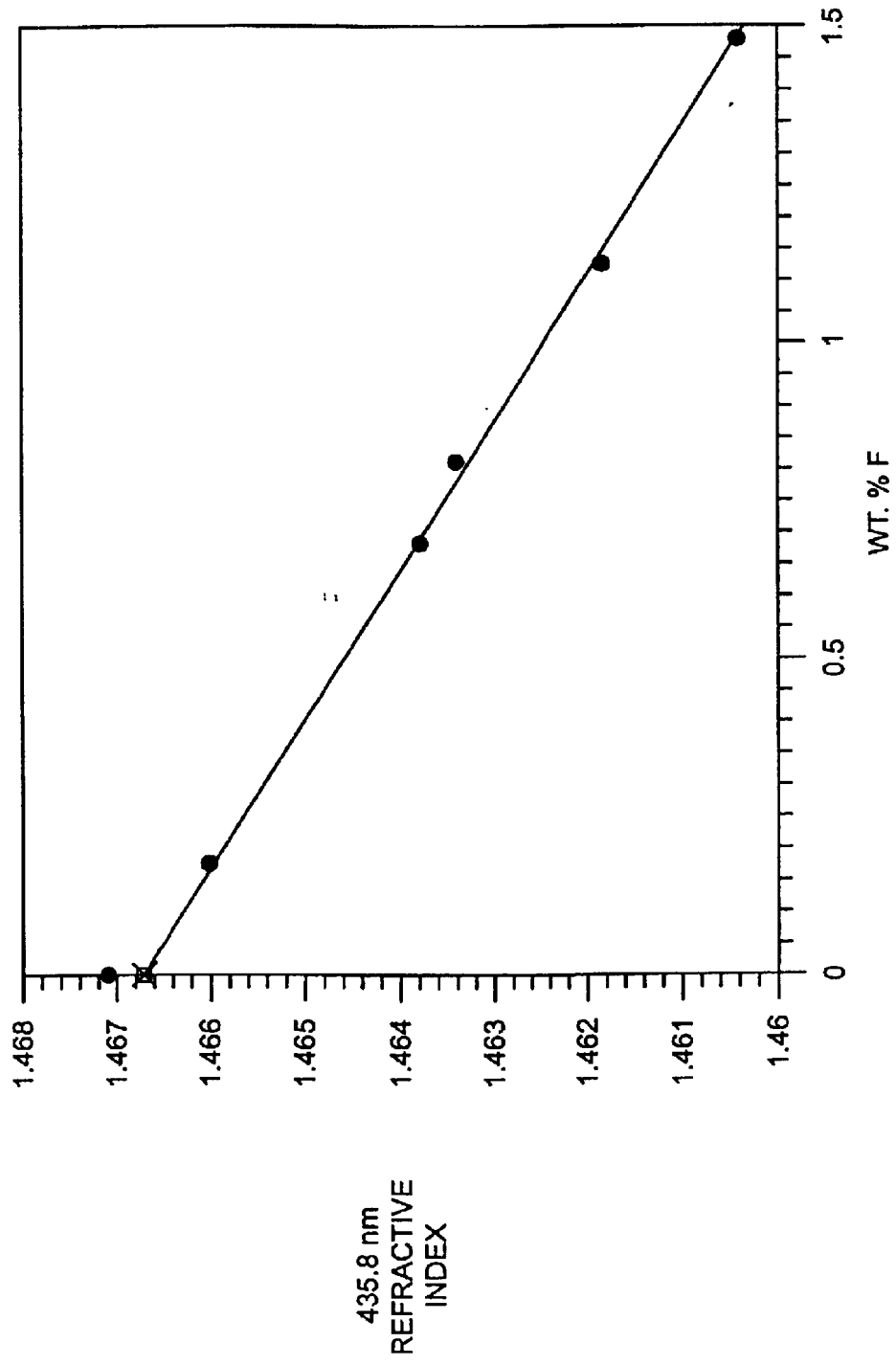
FIG. 15 is a plot of 435.8 nm Refractive Index vs. wt. % F in accordance with the invention.
Figure 16:
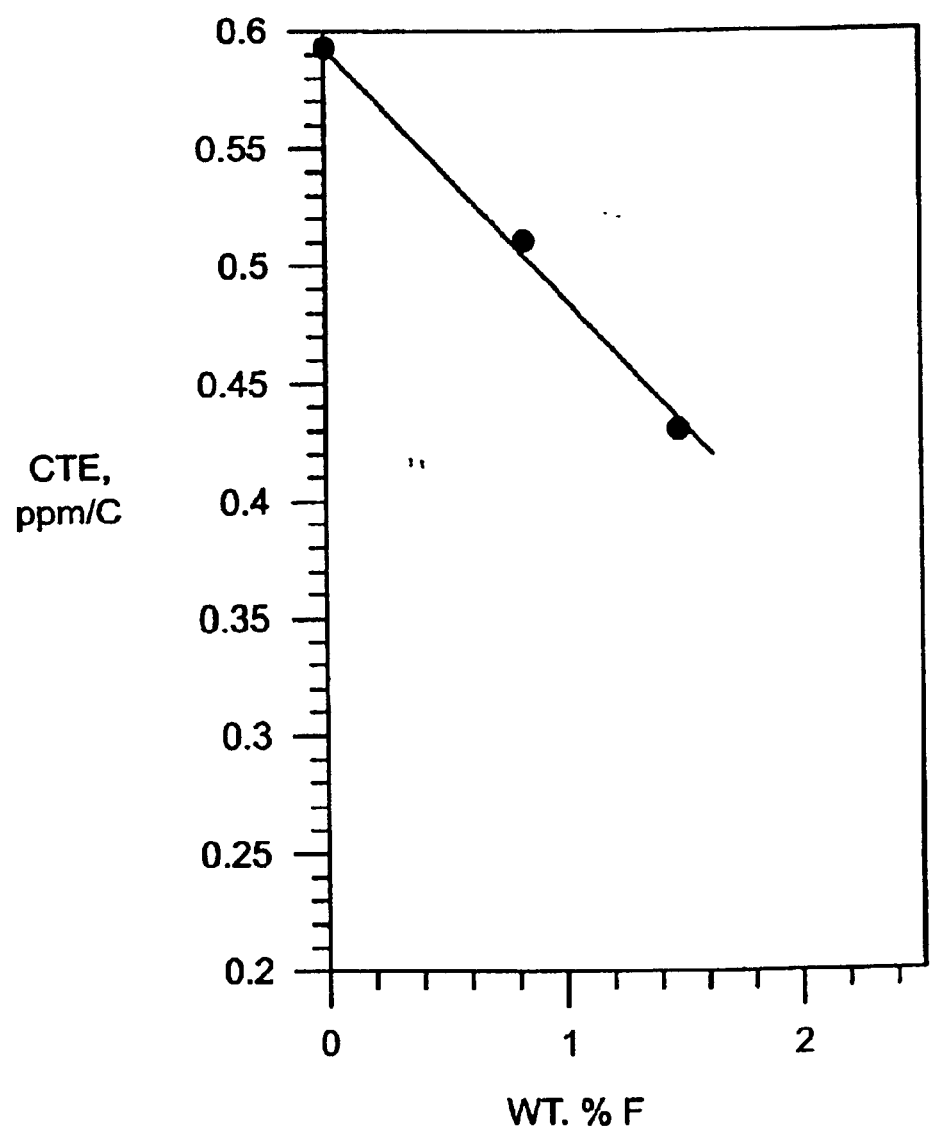
FIG. 16 is a plot of CTE vs. wt. % F in accordance with the invention.
Figure 17:
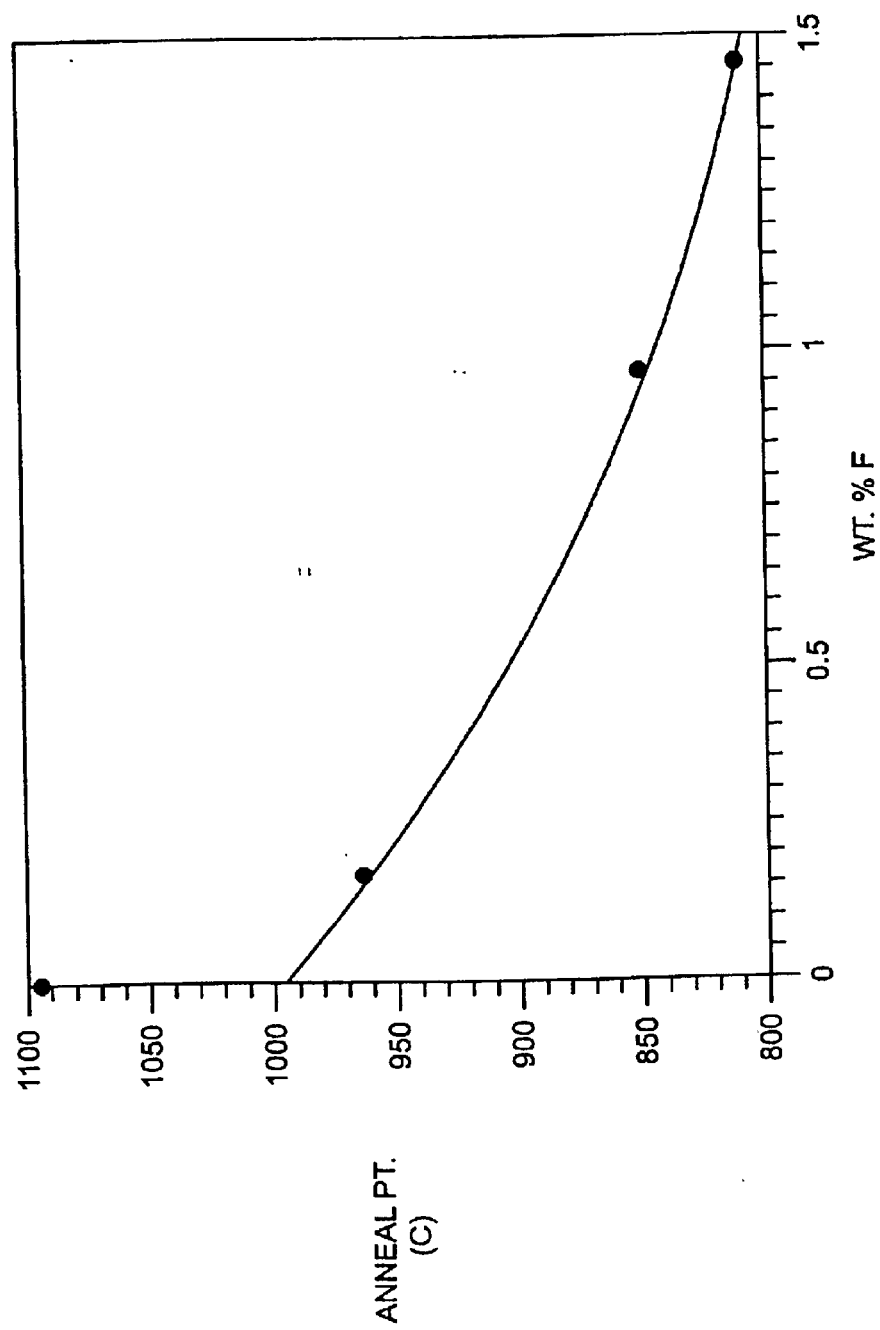
FIG. 17 is a plot of Anneal Point (Centigrade) vs. wt. % F in accordance with the invention.
Figure 18:
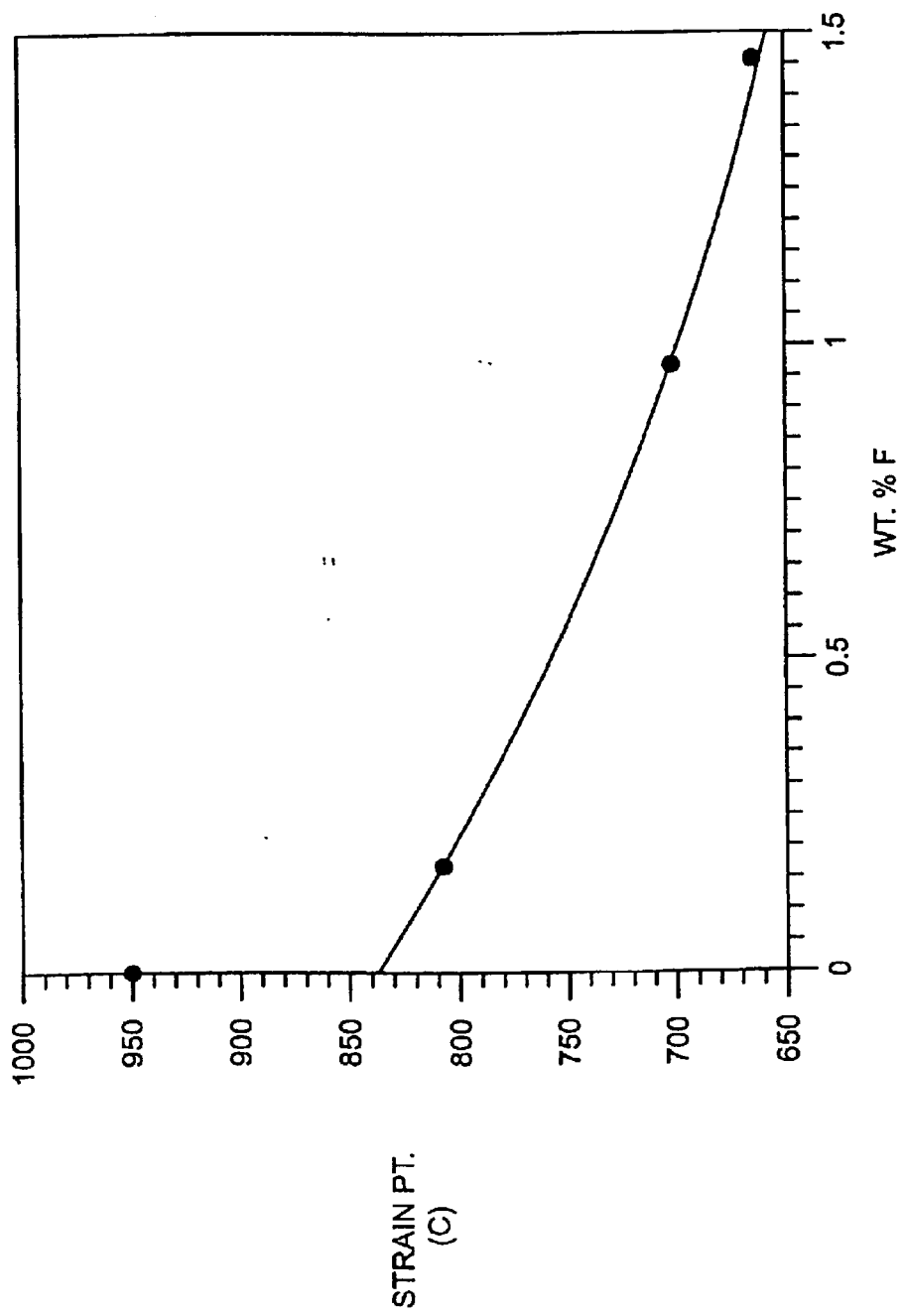
FIG. 18 is a plot of Strain Point (Centigrade) vs. wt. % F in accordance with the invention.
Figure 20:
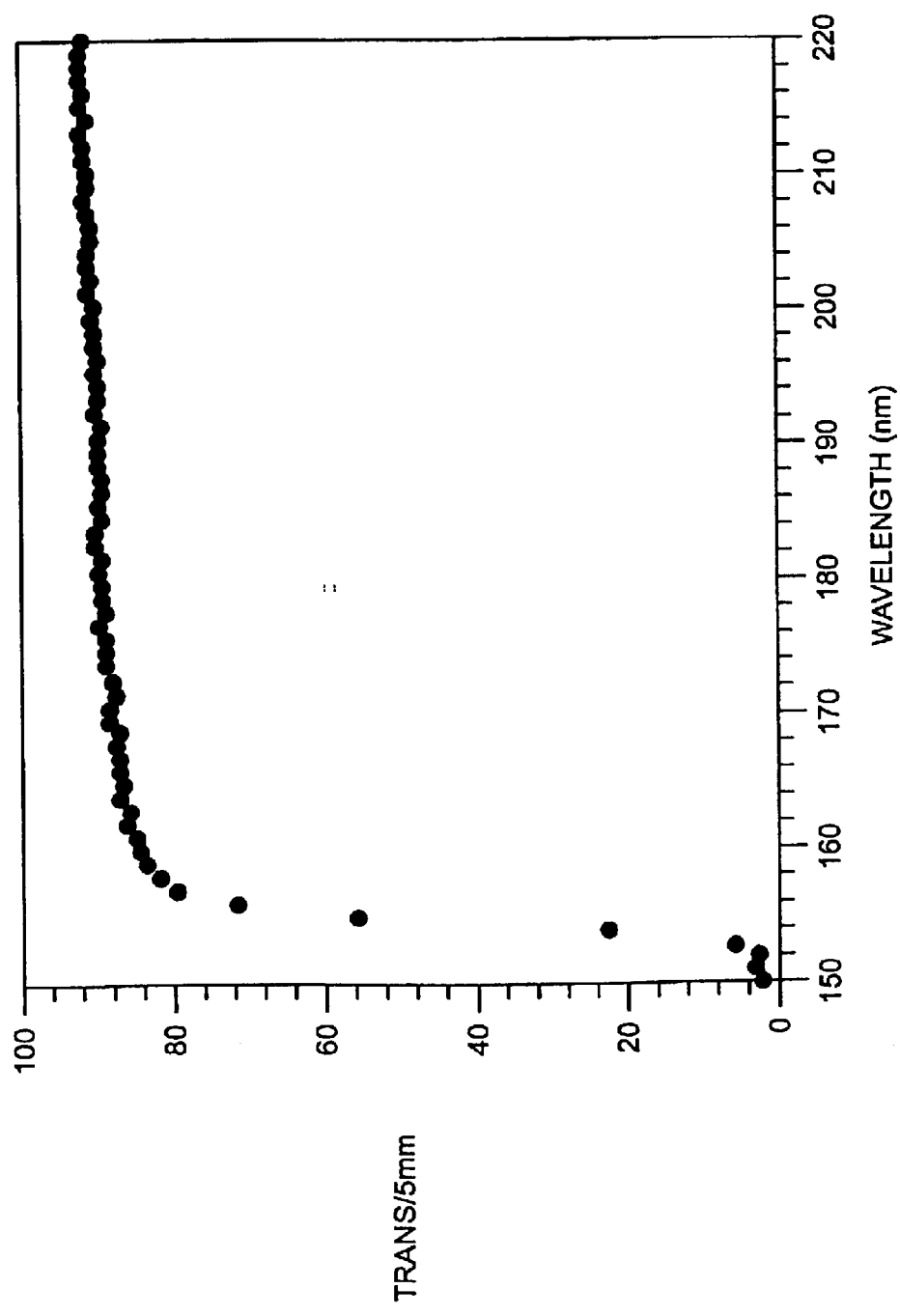
FIG. 20 is a transmission spectra plot of a silicon oxyfluoride glass in accordance with the invention with measured transmission % through a 5 mm sample vs. wavelength.

FIG. 14 is a plot of refractive index versus wavelength for the samples. FIG. 15 is a plot of 435.8 nm refractive index versus wt. % F. The samples are represented by closed circles, the λ represents the index data for Corning Incorporated HPFS® brand silica glass and the open square represents the index data for pure silica taken from I. H. Malitoson "Interspecimen Comparison of the Refractive Index of Fused Silica" J. Opt. Soc. America 55(10), 1205–1209, 1965; with both being 1.4667. FIG. 16 is a plot of coefficient of thermal expansion as a function of fluorine level on samples studied from room temperature to 300° C., with the samples having been annealed by heating for 1 hour at their annealing point and then cooled at a rate of 100° C./hr to room temperature. Anneal point temperatures were measured on samples containing 0, 0.17, 0.96 and 1.45 wt. % F, with the anneal point defined as the temperature at which the viscosity is $10^{13.2}$ poise. The anneal point data is plotted in FIG. 17. Strain point data was taken from the same fluorine sample levels and is defined as the temperature at which the viscosity is $10^{14.7}$ poise. The strain point data is plotted in FIG. 18. FIG. 20 shows the VUV spectrum of a silicon oxyfluoride glass of the invention with the measured transmission % through a 5 mm thick sample. The silicon oxyfluoride glass of FIG. 20 has a 0.94 wt. % F content. The silicon oxyfluoride glass of FIG. 20 was made in accordance with the invention from a 1532 g $SiO_2$ soot tube formed in accordance with FIG. 7 with $SiCl_4$ as the Si feedstock, which was then treated for 60 minutes at 1100 degree C. with a treatment atmosphere of 0.066 slpm $Cl_2$ and 40.6 slpm He, then 150 minutes at 1225 degree C. with a treatment atmosphere of 0.8 slpm $CF_4$ and 39.2 slpm He, and then downdriven into the sinter zone (1480 degree C. peak temperature) at 5 mm/min with a treatment atmosphere of 0.8 slpm $CF_4$ and 39.2 slpm He.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A below 240 nm optical lithography device for manipulating optical lithography radiation having a wavelength band centered about a selected λ in the range 157 nm to less than 240 nm, said device comprising an optical lithography element body, said optical lithography element body comprised of an optical lithography medium having an internal transmission of at least 80%/cm at said selected λ, and an optical lithography coating overlaying said optical lithography element, said optical coating comprised of a silicon oxyfluoride film, said silicon oxyfluoride film having a 50% transmission short cutoff wavelength at a, wavelength less than said selected λ.

2. A device as claimed in claim 1 wherein the thickness of said silicon oxyfluonde film correlates to the wavelength band centered about said selected λ.

3. A device as claimed in claim 1 wherein said silicon oxyfluoride film has a thickness TH with TH<2 λ.

4. A device as claimed in claim 1 wherein said silicon oxyfluoride film has a thickness TH with TH≦λ.

5. A device as claimed in claim 1 wherein said silicon oxyfluoride film has a thickness TH, with TH=(1/N)λ where N is a whole number greater one.

6. A device as claimed in claim 5 wherein N is four.

7. A device as claimed in claim 1 wherein said silicon oxyfluoride film has a thickness TH=P(λ/4) where P is a whole number greater than zero.

8. A device as claimed in claim 1 wherein said optical coating is a vapor deposited silicon oxyfluoride film.

9. A device as claimed in claim 1 wherein said silicon oxyfluoride film has a fluorine content of 0.1 to 2 weight percent.

10. A device as claimed in claim 1 wherein said silicon oxyfluoride film consists essentially of Si, O and F.

11. A device as claimed in claim 1 wherein said silicon oxyfluoride film has an OH content below 50 ppm by weight.

12. A device as claimed in claim 1 wherein said silicon oxyfluoride film an OH content below 10 ppm by weight.

13. A device as claimed in claim 1 wherein said silicon oxyfluoride film has a chlorine content below 5 ppm by weight.

14. A device as claimed in claim 1 wherein said silicon oxyfluoride film has a fluorine content of at least 0.05 weight percent.

15. A device as claimed in claim 1 wherein said silicon oxyfluoride film has a fluorine content of at least 0.1 weight percent.

16. A device as claimed in claim 1 wherein said silicon oxyfluoride film has a fluorine content of at least 0.3 weight percent.

17. A device as claimed in claim 1 wherein said silicon oxyfluoride film has a fluorine content of at least 0.4 weight percent.

18. A device as claimed in claim 1 wherein said silicon oxyfluoride film is vapor deposited from a silicon oxyfluoride glass which has an internal transmission of at least 80%/cm at 193 nm.

19. A device as claimed in claim 1 wherein said silicon oxyfluoride film is vapor deposited from a silicon oxyfluoride glass which has an internal transmission of at least 80%/cm at 157 nm.

20. A devise as claimed in claim 1 wherein $\lambda=193$ nm.

21. A device as claimed in claim 1 wherein $\lambda=157$ nm.

22. A device as claimed in claim 1 wherein said optical lithography medium is comprised of Si.

23. A device as claimed in claim 1 wherein said optical lithography medium is comprised of $SiO_2$.

24. A device as claimed in claim 1 wherein said optical lithography medium is comprised of silica glass.

25. A device as claimed in claim 1 wherein said optical lithography medium is comprised of silicon oxyfluoride glass.

26. A device as claimed in claim 1 wherein said optical lithography medium is comprised of a fluoride crystal.

27. A device as claimed in claim 1 wherein said optical lithography medium is comprised of a calcium fluoride crystal.

28. A device as claimed in claim 1 wherein said optical lithography device comprises at least a second film.

* * * * *